US012688883B2

(12) United States Patent
Kim et al.

(10) Patent No.: US 12,688,883 B2
(45) Date of Patent: Jul. 21, 2026

(54) MEMORY DEVICE AND MEMORY MODULE INCLUDING THE SAME

(71) Applicant: SAMSUNG ELECTRONICS CO., LTD., Suwon-si (KR)

(72) Inventors: Ki-Heung Kim, Suwon-si (KR); ChangSik Yoo, Suwon-si (KR); Jeongdon Ihm, Suwon-si (KR); Hyongryol Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 71 days.

(21) Appl. No.: 18/818,007

(22) Filed: Aug. 28, 2024

(65) Prior Publication Data

US 2025/0078906 A1     Mar. 6, 2025

(30) Foreign Application Priority Data

Aug. 29, 2023     (KR) ........................ 10-2023-0114053
Feb. 16, 2024     (KR) ........................ 10-2024-0022946

(51) Int. Cl.
| | |
|---|---|
| *G11C 11/408* | (2006.01) |
| *G11C 8/12* | (2006.01) |
| *G11C 11/4093* | (2006.01) |
| *G11C 11/4096* | (2006.01) |
| *G11C 8/10* | (2006.01) |

(52) U.S. Cl.
CPC ............ *G11C 11/4087* (2013.01); *G11C 8/12* (2013.01); *G11C 11/4093* (2013.01); *G11C 11/4096* (2013.01); *G11C 8/10* (2013.01)

(58) Field of Classification Search
CPC ... G11C 11/4087; G11C 8/12; G11C 11/4093; G11C 11/4096; G11C 8/10
See application file for complete search history.

(56) References Cited

U.S. PATENT DOCUMENTS

| | | | |
|---|---|---|---|
| 10,606,692 B2 | 3/2020 | Coteus et al. | |
| 12,524,298 B2 * | 1/2026 | Ayyapureddi ...... | G06F 11/1004 |
| 2009/0251954 A1 | 10/2009 | Wang et al. | |
| 2013/0019051 A1 | 1/2013 | Somanache et al. | |
| 2016/0027492 A1 | 1/2016 | Byun et al. | |
| 2018/0358060 A1 * | 12/2018 | Cha ........................ | G11C 7/106 |
| 2019/0250985 A1 * | 8/2019 | Seo ..................... | G06F 11/1048 |
| 2021/0055987 A1 * | 2/2021 | Byun ................. | G06F 11/1068 |

(Continued)

FOREIGN PATENT DOCUMENTS

| | | |
|---|---|---|
| KR | 10-2023-0099477 | 7/2023 |
| WO | WO 2022159184 A1 | 7/2022 |

OTHER PUBLICATIONS

Extended European Search Report in European Appln. No. 24196568.0, mailed on Jan. 24, 2025, 9 pages.

*Primary Examiner* — Jay W. Radke
(74) *Attorney, Agent, or Firm* — Fish & Richardson P.C.

(57) ABSTRACT

A memory device includes a bank array including a plurality of memory cells, a row decoder connected to the bank array through a plurality of wordlines, and a column decoder connected to the bank array through a plurality of column select lines. The bank array may include a first region and a second region different from the first region. First metadata for first normal data stored in the first region is stored in the second region, and second metadata for second normal data stored in the second region is stored in the first region.

20 Claims, 32 Drawing Sheets

(56)            References Cited

U.S. PATENT DOCUMENTS

| | | |
|---|---|---|
| 2021/0064467 A1* | 3/2021 | Buerkle ............... G06F 11/1076 |
| 2021/0208965 A1* | 7/2021 | Cha ...................... G06F 11/1068 |
| 2021/0286727 A1 | 9/2021 | Bains |
| 2023/0178168 A1* | 6/2023 | Cho ................... G11C 29/4401 |
| | | 365/185.09 |
| 2023/0205428 A1 | 6/2023 | Kim et al. |
| 2023/0223096 A1 | 7/2023 | Bains et al. |
| 2023/0326511 A1* | 10/2023 | Oh ...................... G11C 11/4063 |
| | | 365/222 |
| 2023/0333928 A1 | 10/2023 | Hinck et al. |
| 2023/0352064 A1 | 11/2023 | Ayyapureddi |
| 2024/0110643 A1* | 4/2024 | Littlefield ............. F16L 3/1016 |
| 2024/0176699 A1* | 5/2024 | Ayyapureddi ...... G06F 11/1048 |
| 2024/0289266 A1* | 8/2024 | Ayyapureddi ...... G06F 12/0223 |

* cited by examiner

|  | Normal | Meta |
|---|---|---|
| Ratio | 8 | 1 |
| Coding | CSL0_Left | MCSL56<0> |

| Ratio | Normal | Meta |
|-------|--------|------|
| 8 | 8 | 1 |
| Coding | CSL0_Right | MCSL56<1> |

| | Normal | Meta |
|---|---|---|
| Ratio | 8 | 1 |
| Coding | CSL1_Left | MCSL56<2> |

| | Normal | Meta |
|---|---|---|
| Ratio | 8 | 1 |
| Coding | CSL1_Right | MCSL56 <3> |

| | Normal | Meta |
|---|---|---|
| Ratio | 8 | 1 |
| Coding | CSL7_Left | MCSL56<14> |

| Ratio | Normal | Meta |
|---|---|---|
| | 8 | 1 |
| Coding | CSL7_Right | MCSL56<15> |

| | Normal | Meta |
|---|---|---|
| Ratio | 8 | 1 |
| Coding | CSL55_Left | MCSL62<14> |

| | Normal | Meta |
|---|---|---|
| Ratio | 8 | 1 |
| Coding | CSL55_Right | MCSL62 <15 > |

| Left/Right | L | H | L | H | L | H | ... | L | H | L | H | L | H | L | H | ... | L | H |
|---|---|---|---|---|---|---|---|---|---|---|---|---|---|---|---|---|---|---|
| CSL | 0 | 0 | 1 | 1 | 2 | 2 | ... | 7 | 7 | 8 | 8 | 9 | 9 | ... | 15 | 15 |
| MCSL56 | $1/16$ | $1/16$ | $1/16$ | $1/16$ | $1/16$ | $1/16$ | ... | $1/16$ | $1/16$ | | | | | | | |
| MCSL57 | | | | | | | | | | $1/16$ | $1/16$ | $1/16$ | $1/16$ | ... | $1/16$ | $1/16$ |

FIG. 15C

| | 48 | 48 | 49 | 49 | 50 | 50 | ••• | 55 | 55 | 56 | 56 | 57 | 57 | 58 | 58 | 59 | 59 | 60 | 60 | 61 | 61 | 62 | 62 | 63 | 63 |
|---|---|---|---|---|---|---|---|---|---|---|---|---|---|---|---|---|---|---|---|---|---|---|---|---|---|
| | L | H | L | H | L | H | ••• | L | H | L | H | L | H | H | L | H | L | H | L | L | H | L | H | | |
| | | | | | | | | | | | | | | | | | | | | | | | | | |
| | | | | | | | | | | | | | | | | | | | | | | | | | |
| | | | | | | | | | | | | | | | | | | | | | | | | | |
| | | | | | | | | | | | | | | | | | | | | | | | | | |
| | | | | | | | | | | | | | | | | | | | | | | | | | |
| | | | | | | | | | | | | | | | | | | | | | | | | | |
| | 1/16 | 1/1 16 | 1/1 16 | 1/1 16 | 1/1 16 | 1/1 16 | •o•o | 1/1 16 | 1/ 16 | | | | | | | | | | | | | | | |
| | | | | | | | | | 8/ 16 | 8/ 8/ 16 16 | 8/ 8/ 16 16 | 8/ 8/ 16 16 | 8/ 8/ 16 16 | 8/ 8/ 16 16 | 8/ 8/ 16 16 | 8/ 8/ 16 16 | 8/ 8/ 16 16 | 8/ 8/ 16 16 | 8/ 8/ 16 16 | 8/ 8/ 16 16 | 8/ 8/ 16 16 | | | |

| Memory Device 101 | Memory Device 102 | Memory Device 103 | Memory Device 104 | Memory Device 105 |
| Memory Device 106 | Memory Device 107 | Memory Device 108 | Memory Device 109 | Memory Device 110 |

RCD 150

| Memory Device 111 | Memory Device 112 | Memory Device 113 | Memory Device 114 | Memory Device 115 |
| Memory Device 116 | Memory Device 117 | Memory Device 118 | Memory Device 119 | Memory Device 120 |

CK/CMD/ADDR/DQ/DQS

Figure 19:
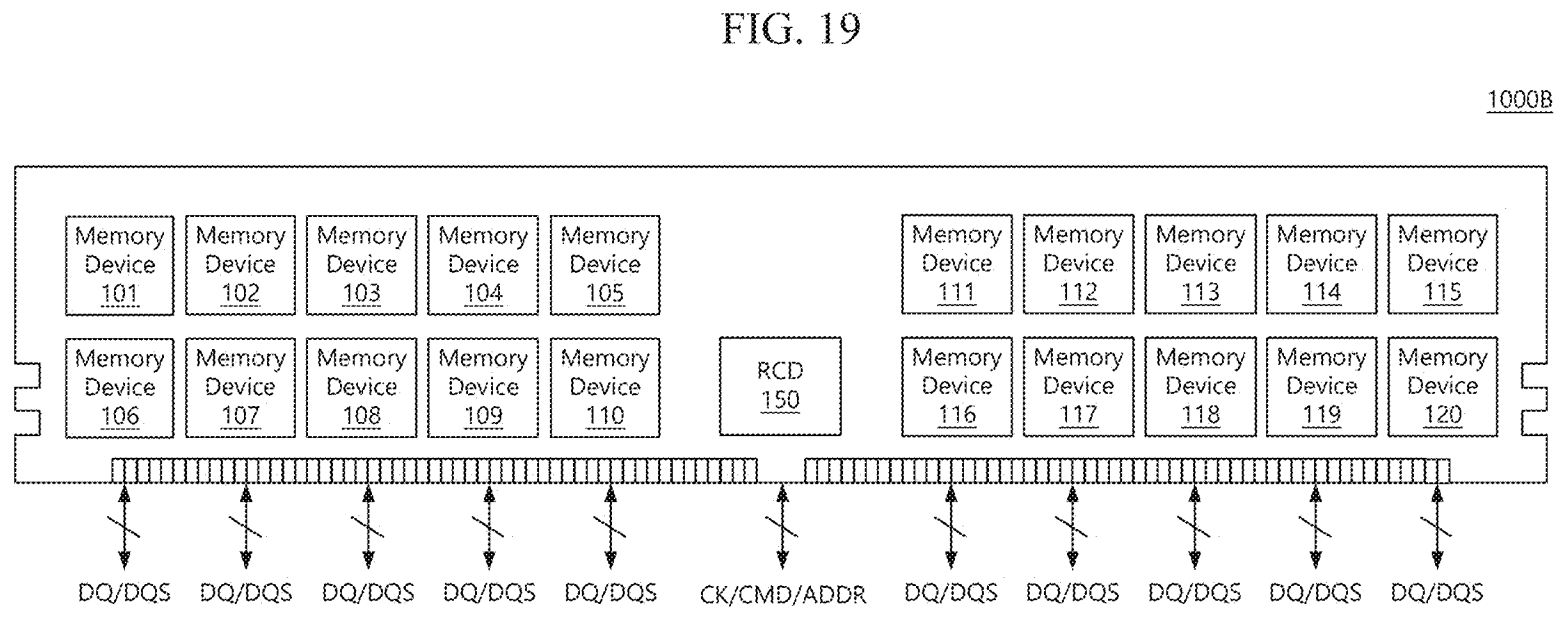

| Memory Device 101 | Memory Device 102 | Memory Device 103 | Memory Device 104 | Memory Device 105 |
| Memory Device 106 | Memory Device 107 | Memory Device 108 | Memory Device 109 | Memory Device 110 |

RCD 150

| Memory Device 111 | Memory Device 112 | Memory Device 113 | Memory Device 114 | Memory Device 115 |
| Memory Device 116 | Memory Device 117 | Memory Device 118 | Memory Device 119 | Memory Device 120 |

DQ/DQS    DQ/DQS    DQ/DQS    DQ/DQS    DQ/DQS    CK/CMD/ADDR    DQ/DQS    DQ/DQS    DQ/DQS    DQ/DQS    DQ/DQS

Rank0

| Memory Device 101 | Memory Device 102 | Memory Device 103 | Memory Device 104 | Memory Device 105 | | Memory Device 111 | Memory Device 112 | Memory Device 113 | Memory Device 114 | Memory Device 115 |
| Memory Device 106 | Memory Device 107 | Memory Device 108 | Memory Device 109 | Memory Device 110 | RCD 150 | Memory Device 116 | Memory Device 117 | Memory Device 118 | Memory Device 119 | Memory Device 120 |

Rank1

| Memory Device 121 | Memory Device 122 | Memory Device 123 | Memory Device 124 | Memory Device 125 | | Memory Device 131 | Memory Device 132 | Memory Device 133 | Memory Device 134 | Memory Device 135 |
| Memory Device 126 | Memory Device 127 | Memory Device 128 | Memory Device 129 | Memory Device 130 | SPD 160 | Memory Device 136 | Memory Device 137 | Memory Device 138 | Memory Device 139 | Memory Device 140 |

Sub-channel 1    Sub-channel 2    Sub-channel 3    Sub-channel 4

MEMORY DEVICE AND MEMORY MODULE INCLUDING THE SAME

CROSS-REFERENCE TO RELATED APPLICATIONS

This application claims to Korean Patent Application Nos. 10-2023-0114053, filed on Aug. 29, 2023, and 10-2024-0022946, filed on Feb. 16, 2024, in the Korean Intellectual Property Office, the disclosures of which are herein incorporated by reference in their entirety.

BACKGROUND

Memory devices are used to store data and are classified into volatile and nonvolatile memory devices. Volatile memory devices lose their stored data when their power supplies are interrupted. A dynamic random access memory (DRAM) is a volatile memory device used in various fields such as mobile systems, servers, and graphics devices.

SUMMARY

In general, in some implementations, the present disclosure is directed toward a memory device that efficiently supports metadata mode.

According to some implementations, the present disclosure is directed to a memory device that includes a bank array including a plurality of memory cells, a row decoder connected to the bank array through a plurality of wordlines, and a column decoder connected to the bank array through a plurality of column select lines. The bank array may include a first region and a second region different from the first region. First metadata for first normal data stored in the first region is stored in the second region, and second metadata for second normal data stored in the second region is stored in the first region.

According to some implementations, the present disclosure is directed to a memory device that includes a bank array including a first region and a second region, a row decoder connected to the first region and the second region through a plurality of wordlines disposed across the first region and the second region, and a column decoder connected to the first region through a plurality of first column select lines disposed in the first region and connected to the second region through a plurality of second column select lines disposed in the second region. First metadata for first normal data stored in the first region may be stored in the second region, and second metadata for second normal data stored in the second region may be stored in the first region.

According to some implementations, the present disclosure is directed to a memory module that includes a plurality of memory devices. Each of the plurality of memory devices may include a bank array comprising a plurality of memory cells, a row decoder connected to the bank array through a plurality of wordlines, and a column decoder connected to the bank array through a plurality of column select lines. The bank array may include a first region and a second region, different from the first region. First metadata for first normal data stored in the first region may be stored in the second region, and second metadata for second normal data stored in the second region may be stored in the first region.

BRIEF DESCRIPTION OF DRAWINGS

Example implementations will be more clearly understood from the following detailed description, taken in conjunction with the accompanying drawings.

FIG. 2 is a block diagram illustrating an example of a memory device according to some implementations.

FIG. 5 is a diagram illustrating an example of a bank according to some implementations.

FIGS. 7A to 14B are detailed views illustrating an example of a read operation of a bank according to an some implementations.

FIGS. 15A to 15C are diagrams illustrating an example of assigning normal data and metadata for each column select line according to some implementations.

FIGS. 18 and 19 are diagrams illustrating a memory module according to some implementations.

FIGS. 20 and 21 are diagrams illustrating an example of a memory module according to some implementations.

DETAILED DESCRIPTION

Hereinafter, example implementations will be described with reference to the accompanying drawings.

Figure 1:
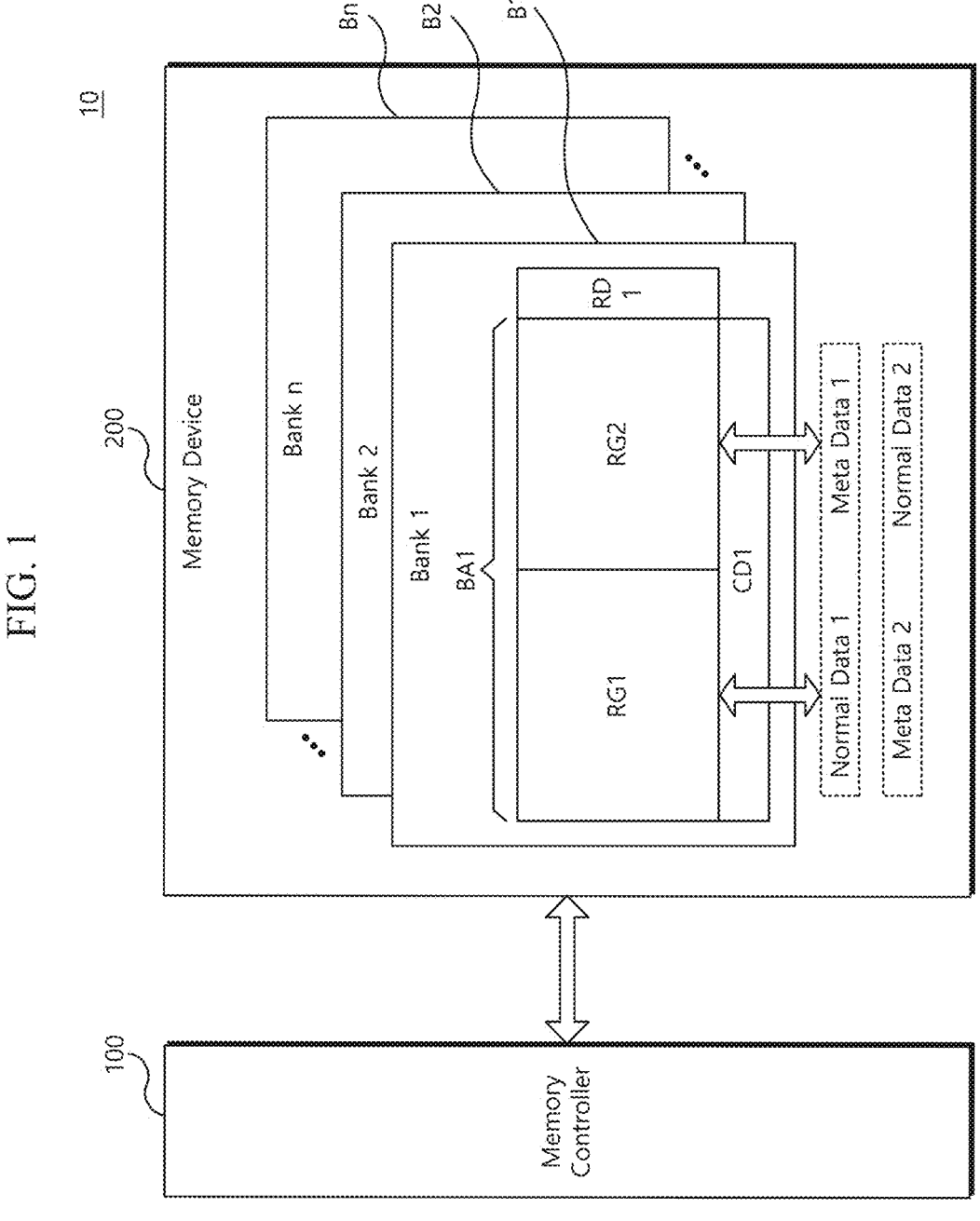
FIG. 1 is a block diagram of an example of a memory system according to some implementations.

FIG. 1 is a block diagram of an example of a memory system according to some implementations. In FIG. 1, a memory system 10 may support metadata mode. The metadata mode may refer to mode in which normal data and metadata corresponding to the normal data are input/output together to a memory device 200.

The memory system 10 may include a plurality of banks B1 to Bn, and each bank may include a bank array. In some implementations, a bank array of at least one of the plurality of banks B1 to Bn may include a first region RG1 and a second region RG2, and each region may store normal data and metadata. For example, the first region RG1 may store first normal data, and the second region RG2 may store first metadata corresponding to the first normal data. In some implementations, read or write operations on the first normal data and the first metadata may be simultaneously performed. For example, the second region RG2 may store second normal data, and the first region RG1 may store second metadata corresponding to the second normal data. In some implementations, write or read operations on the second normal data and the second metadata may be simultaneously performed.

As described above, the memory system 10 may efficiently perform metadata mode by inputting or outputting metadata in one region of a bank array while inputting or outputting normal data in another region of the bank array.

In FIG. 1, the memory system 10 may include a memory controller 100 and a memory device 200. The memory controller 100 may control the memory device 200. For example, the memory controller 100 may control the memory device 200 based on requests from a processor supporting various applications such as a server application, a personal computer (PC) application, or a mobile application. For example, the memory controller 100 may be included in a host including a processor, and may control the memory device 200 based on the requests from the processor.

The memory controller 100 may transmit commands and/or addresses to the memory device 200 to control the memory device 200. In addition, the memory controller 100 may transmit data to the memory device 200 or receive data from the memory device 200.

The memory device 200 may receive data from the memory controller 100 and store the received data. The memory device 200 may read the stored data in response to a request from the memory controller 100 and transmit the read data to the memory controller 100.

In some implementations, the memory device 200 may be a memory device including volatile memory cells. For example, the memory device 200 may be one of various DRAM devices, such as a double data rate synchronous dynamic random access memory (DDR SDRAM) device, a DDR2 SDRAM device, a DDR3 SDRAM device, a DDR4 SDRAM device, a DDR5 SDRAM device, a DDR6 SDRAM device, a low power double data rate (LPDDR) SDRAM device, an LPDDR2 SDRAM device, an LPDDR3 SDRAM device, an LPDDR4 SDRAM device, an LPDDR4X SDRAM device, an LPDDR5 SDRAM device, a graphics double data rate synchronous graphics random access memory (GDDR SGRAM) device, a GDDR2 SGRAM device, a GDDR3 SGRAM device, a GDDR4 SGRAM device, a GDDR5 SGRAM device, or a GDDR6 SGRAM device.

In some implementations, the memory device 200 may be a stacked memory device in which DRAM dies are stacked, such as a high bandwidth memory (HBM) device, an HBM2 device, or an HBM3 device.

In some implementations, the memory device 200 may be included in a memory module or may be a memory module, such as a dual in-line memory module (DIMM). For example, the memory module 100A may be a registered DIMM (RDIMM), a load reduced DIMM (LRDIMM0, an unbuffered DIMM (UDIMM), a fully buffered DIMM (FB-DIMM), a small outline DIMM (SO-DIMM). However, this is only an example, and the memory device 200 may be another memory module, such as a single in-line memory module (SIMM).

In some implementations, the memory device 200 may be an SRAM device, a NAND flash memory device, a NOR flash memory device, an RRAM device, an FRAM device, a PRAM device, a TRAM device, or an MRAM device.

A memory device 200 may include a plurality of banks B1 to Bn. Each of the plurality of banks B1 to Bn may include a bank array, a row decoder, and a column decoder. For example, a first bank B1 may include a first bank array BA1, a first row decoder RD1, and a first column decoder CD1.

A plurality of bank arrays BA1 to BAn may each include memory cells storing data. The row decoder may activate a selected wordline among a plurality of wordlines based on a row address. The column decoder may activate a selected column select line among a plurality of column select lines based on a column address.

For ease of description, an example is provided in which each bank array includes DRAM cells. However, this is only an example, and each bank array may be implemented to include volatile memory cells other than DRAM cells. In some implementations, each bank array may be implemented to include memory cells of the same type, or it may be implemented to include the same type of memory cells.

At least one of the plurality of bank arrays BA1 to BAn may be provided to store normal data and metadata. The metadata may refer to data used to improve the performance or enhance the security of a memory device. For example, the metadata may be parity data to perform an error correction operation on corresponding normal data. For example, the metadata may include information on the type, length, and attributes of corresponding normal data, but example embodiments are not limited thereto.

In some implementations, the bank array includes a first region RG1 and a second region RG2. The first and second regions RG1 and RG2 may store normal data and metadata, respectively. In an example embodiment, one of the first and second regions RG1 and RG2 may store normal data, and the other region may store metadata corresponding to the normal data.

For example, first normal data may be stored in the first region RG1, and first metadata corresponding to the first normal data may be stored in the second region RG2. In some implementations, while the first normal data is written in the first region RG1 or read from the first region RG1, the first metadata may be written in to the second region RG2 or read from the second region RG2.

For example, second normal data may be stored in the second region RG2, and second metadata corresponding to the second normal data may be stored in the first region RG1. In some implementations, while the second normal data is written in the second region RG2 or read from the second region RG2, the second metadata may be written in the first region RG1 or read from the first region RG1.

As described above, normal data may be written in or read from one region of a bank array while metadata is written in or read from another region of the bank array, the memory system 10 according to an example embodiment may efficiently support metadata mode.

Figure 2:
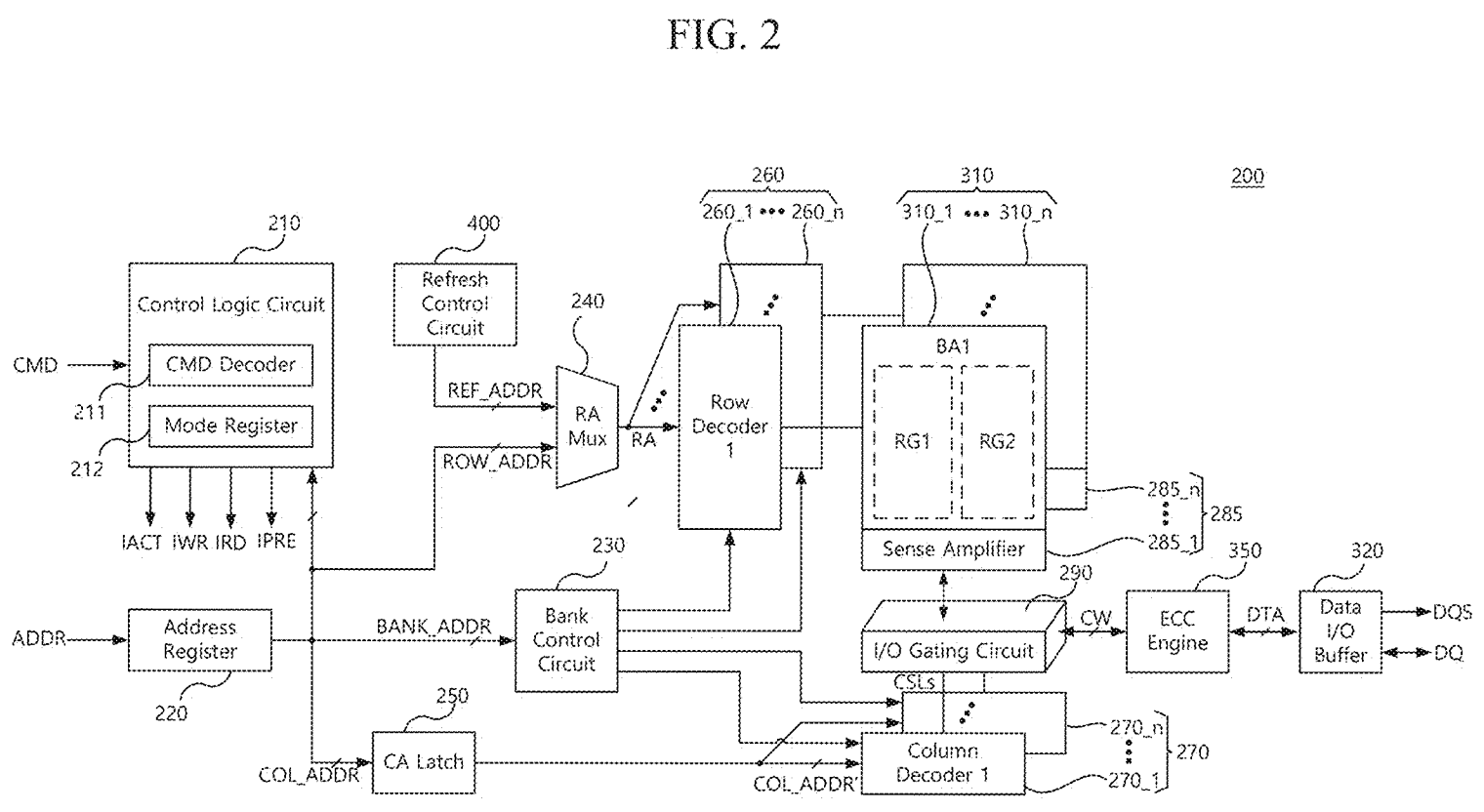

FIG. 2 is a block diagram illustrating an example of a memory device 200 according to some implementations. In some implementations, the memory device 200 of FIG. 2 may correspond to the memory device 200 of FIG. 1.

In FIG. 2, the memory device 200 may include control logic circuit 210, an address register 220, a bank control logic 230, a refresh control circuit 400, a row address multiplexer 240, a column address latch 250, a row decoder group 260, a column decoder group 270, a memory cell array 310, a sense amplifier unit 285, an input/output (I/O) gating circuit 290, an error correction code (ECC) engine 350, and a data input/output (I/O) buffer 320.

The memory cell array 310 may include a plurality of bank arrays 310_1 to 310_n. Each of the plurality of bank arrays 310_1 to 310_n may include a plurality of memory cells. For example, each of the plurality of memory cells may be formed at an intersection of a corresponding wordline and a corresponding bitline.

The row decoder group 260 may include a plurality of row decoders 260_1 to 260_n. Each of the plurality of row decoders 260_1 to 260_n may be connected to a corresponding bank array, among the plurality of bank arrays 310_1 to 310_n.

The sense amplifier unit 285 may include a plurality of sense amplifiers 285_1 to 285_n. Each of the plurality of sense amplifiers 285_1 to 285_n may be connected to a corresponding bank array, among the plurality of bank arrays 310_1 to 310_n.

The column decoder group 270 may include a plurality of column decoders 270_1 to 270_n. Each of the plurality of column decoders 270_1 to 270_n may be connected to a corresponding bank array, among the plurality of bank arrays 310_1 to 310_n, through column select lines CSLs.

In some implementations, each of the plurality of bank arrays 310_1 to 310_n may include a first region RG1 and a second region RG2. The first region RG1 and the second region RG2 may include a normal data region storing normal data and a metadata region storing metadata, respectively.

For example, the normal data region of the first region RG1 and the metadata region of the second region RG2 may correspond to each other. For example, metadata corresponding to normal data stored in the normal data region of the first region RG1 may be stored in the metadata region of the second region RG2, and metadata corresponding to normal data stored in the normal data region of the second region RG2 may be stored in the metadata region of the first region RG1.

The address register 220 may receive an address ADDR, including a bank address BANK_ADDR, a row address ROW_ADDR, and a column address COL_ADDR, from a memory controller 100. The address register 220 may provide the received bank address BANK_ADDR to the bank control logic 230, provide the received row address ROW_ADDR to the row address multiplexer 240, and provide the received column address COL_ADDR to the column address latch 250.

The bank control logic 230 may generate bank control signals in response to a bank address BANK_ADDR. For example, among the plurality of row decoders 260_1 to 260_n, a row decoder corresponding to the bank address BANK_ADDR may be activated in response to the bank control signals. Among the plurality of column decoders 270_1 to 270_n, a column decoder corresponding to the bank address BANK_ADDR may be activated in response to the above bank control signals.

The row address multiplexer 240 may receive a row address ROW_ADDR from the address register 220 and a refresh row address REF_ADDR from the refresh control circuit 400. The row address multiplexer 240 may selectively output the row address ROW_ADDR or the refresh row address REF_ADDR as a row address RA. The row address RA, output from the row address multiplexer 240, may be applied to each of the plurality of row decoders 260_1 to 260_n.

The refresh control circuit 400 may sequentially increase or decrease the refresh row address REF_ADDR in normal refresh mode in response to refresh signals from the control logic circuit 210.

The refresh control circuit 400 may receive a hammer address HADDR in hammer refresh mode. The refresh control circuit 400 may output addresses of wordlines, adjacent to intensively accessed wordlines, as refresh row addresses REF_ADDR based on the hammer address HADDR.

Among the plurality of row decoders 260_1 to 260_n, a row decoder selected by the bank control logic 230A may activate a wordline corresponding to a row address RA output from the row address multiplexer 240. For example, the selected row decoder may apply a wordline driving voltage to a wordline corresponding to the row address.

The column address latch 250 may receive the column address COL_ADDR from the address register 220 and temporarily store the received column address COL_ADDR. For example, in burst mode, the column address latch 250 may incrementally increase the received column address COL_ADDR. The column address latch 250 may apply the temporarily stored or incrementally increased column address COL_ADDR' to each of the plurality of column decoders 270_1 to 270_n.

Among the plurality of column decoders 270_1 to 270_n, a column decoder activated by the bank control logic 230 may activate a sense amplifier corresponding to the bank address BANK_ADDR and column address COL_ADDR through the input/output gating circuit 290.

The input/output gating circuit 290 may include circuits inputting/outputting data. The input/output gating circuit 290 may include data latches, storing codewords output from the plurality of bank arrays 310_1 to 310_n, and write drivers writing data in the plurality of bank arrays 310_1 to 310_n.

In some implementations, during a read operation, a codeword CW read from a selected bank array among the plurality of bank arrays 310_1 to 310_n may be detected by a sense amplifier corresponding to the selected bank array and may be stored in the data latches of the input/output gating circuit 290. The codeword CW stored in the data latches may be ECC-decoded by the ECC engine 350 and provided to the data input/output buffer 320 as data DTA. The data input/output buffer 320 may generate a data signal DQ based on the data DTA and provide the data signal DQ to the memory controller 100 along with a strobe signal DQS.

In some implementations, during a write operation, the data DTA to be written in a selected bank array among the plurality of bank arrays 310_1 to 310_n may be received by the data input/output buffer 320 as a data signal DQ. The data input/output buffer 320 may convert the data signal DQ into the data DTA and provide the data DTA to the ECC engine 350. The ECC engine 350 may generate parity bits (or parity data) based on the data DTA and provide a codeword CW, including the data DTA and the parity bits, to the input/output gating circuit 290. The input/output gating circuit 290 may write the codeword CW to the selected bank array.

The data input/output buffer 320 may convert the data signal DQ into data DTA and provide the data DTA to the ECC engine 350 during a write operation. The data input/output buffer 320 may convert the data DTA, provided from the ECC engine 350, into a data signal DQ during a read operation.

The ECC engine 350 may perform ECC encoding on the data DTA during a write operation. The ECC engine 350 may perform ECC decoding on the codeword CW during a read operation.

The control logic circuit 210 may control the operation of the memory device 200. For example, the control logic circuit 210 may generate control signals to control the memory device 200 to perform a write operation, a read operation, a normal refresh operation, and a hammer refresh operation. The control logic circuit 210 may include a command decoder 211, decoding a command CMD received from the memory controller 100, and a mode register set (MRS) 212 setting operation mode of the memory device 200.

The command decoder 211 may decode the command CMD to generate internal command signals such as an internal active signal IACT, an internal precharge signal IPRE, an internal read signal IRD, and an internal write signal IWR. The command decoder 211 may decode a chip select signal and a command/address signal to generate control signals corresponding to the command CMD.

The mode register set 212 may set the operation mode of the memory device 200. In some implementations, the mode register set 212 may set the operation mode of the memory device 200 to metadata mode. The "metadata mode" may refer to mode in which both user data and metadata are stored in the memory device 200. The metadata may be used to improve the performance and security of a memory device.

In some implementations, the mode register set 212 may set the operation mode of the memory device 200 to general mode. The "general mode" may refer to mode in which only user data, excluding metadata, is stored in the memory device 200. In general mode, user data may also be stored in a region in which metadata is stored in metadata mode.

In some implementations, the first region RG1 and the second region RG2 of the bank array may be activated during a write operation or a read operation.

For example, first normal data may be stored in the first region RG1 of the first bank array BA1, and first metadata corresponding to the first normal data may be stored in the second region RG2. In some implementations, a column select line corresponding to the first normal data of the first region RG1 and a column select line corresponding to the first metadata of the second region RG2 may be simultaneously activated during a write operation or a read operation. Accordingly, the first normal data and the corresponding first metadata may be input or output together.

For example, second normal data may be stored in the second region RG2 of the first bank array BA1, and second metadata corresponding to the second normal data may be stored in the first region RG1. In some implementations, a column select line corresponding to the second normal data of the second region RG2 and a column select line corresponding to the second metadata of the first region RG1 may be simultaneously activated during a write operation or a read operation. Accordingly, the second normal data and the corresponding second metadata may be input or output together.

As described above, normal data and metadata of the bank array may be input and output to efficiently perform metadata mode.

Figure 3:
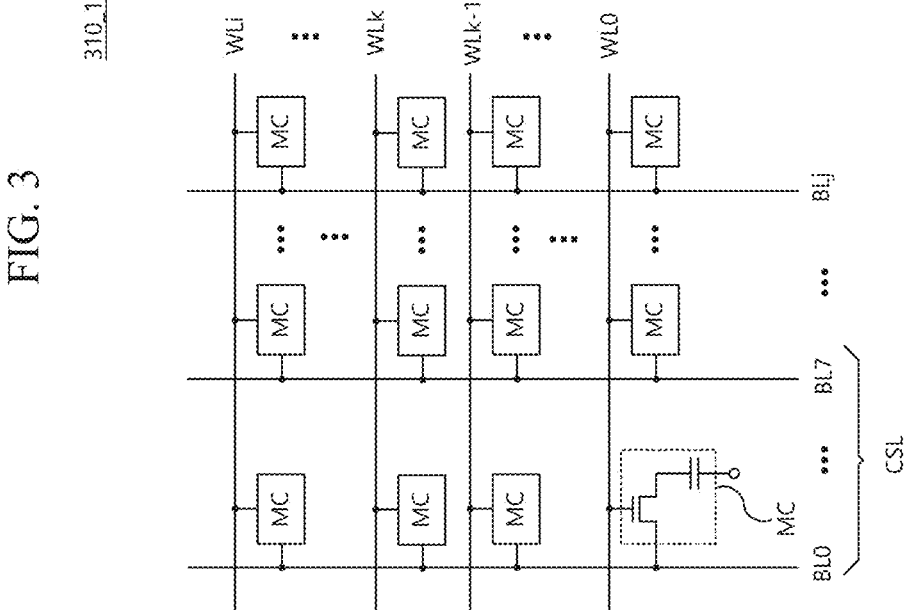
FIG. 3 is a diagram illustrating an example of a bank array according to some implementations.

FIG. 3 is a diagram illustrating an example of a bank array according to some implementations. In some implementations, a bank array 310_1 of FIG. 3 may correspond to, for example, the first bank array 310_1 of FIG. 2. For ease of description, in FIG. 3, an example is provided in which a single column select line CSL corresponds to eight bitlines.

In FIG. 3, the first bank array 310_1 may include a plurality of wordlines WL0 to WLi, a plurality of bitlines BL0 to BLj, and a plurality of memory cells MC disposed at the intersections of the wordlines WL0 to WLi and bitlines BL0 to BLj.

In some implementations, each memory cell MC may be a DRAM cell. For example, each memory cell MC may include a cell transistor, connected to a wordline and a bitline, and a cell capacitor connected to the cell transistor.

A single column select line CSL may be electrically connected to a plurality of bitlines. For example, the single column select line CSL may be electrically connected to eight bitlines. In some implementations, 8 bits of data may be read from or written in memory cells MCs through a single wordline and a single column select line CSL. However, this is only an example, and a single column select line CSL may be implemented to be electrically connected to a different number of bitlines.

According to some implementations, wordlines extending in a row direction may be referred to as a row of the first bank array 310_1. Column select lines CSLs extending in a column direction may be referred to as a column of the first bank array 310_1. However, this is only an example, and bitlines extending in the column direction may also be referred to as a column of the first bank array 310_1.

In the following description, the phrase "data is stored in a column select line" may mean that data is stored in memory cells corresponding to a column select line. Also, the phrase "data is stored in a wordline" may mean that data is stored in memory cells corresponding to a wordline.

Figure 4:
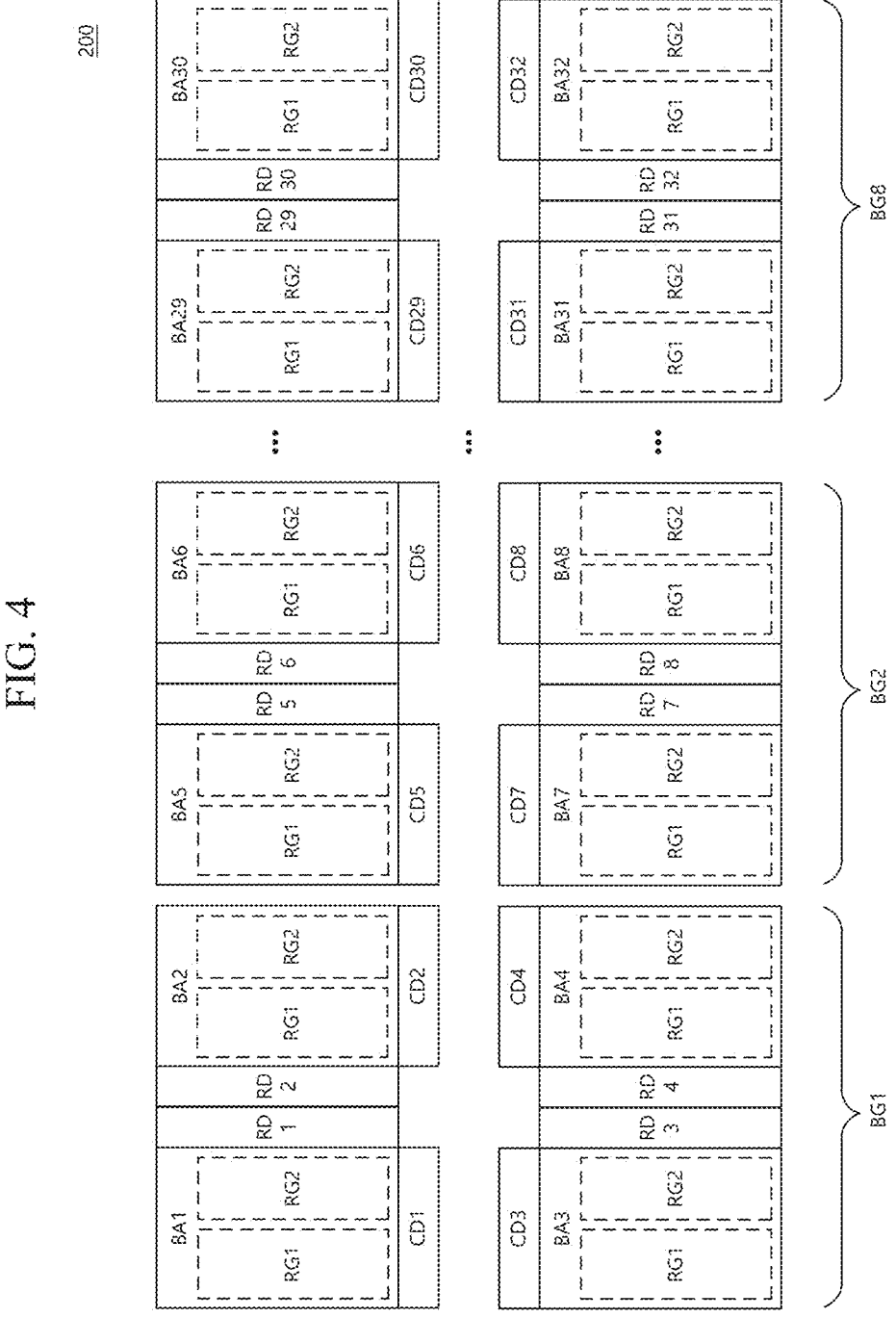
FIG. 4 is a diagram illustrating an example of a memory device according to some implementations.

FIG. 4 is a diagram illustrating an example of a memory device according to some implementations, including an arrangement of bank arrays and corresponding row decoders and column decoders. The memory device 200 of FIG. 4 may correspond to, for example, the memory device 200 of FIGS. 1 and 2. For ease of description, an example is provided in which the memory device 200 includes 32 bank arrays and a single bank group BG includes 4 bank arrays.

In FIG. 4, a first bank group BG1 may include first to fourth bank arrays BA1 to BA4. For example, the first and second bank arrays BA1 and BA2 may be disposed adjacent to each other on an upper portion of a substrate, not illustrated, and the third and fourth bank arrays BA3 and BA4 may be disposed adjacent to each other on a lower portion of the substrate.

A first row decoder RD1 and a first column decoder CD1 may correspond to the first bank array BA1, and a second row decoder RD2 and a second column decoder CD2 may correspond to the second bank array BA2. In addition, a third row decoder RD3 and a third column decoder CD3 may correspond to the third bank array BA3, and a fourth row decoder RD4 and a fourth column decoder CD4 may correspond to the fourth bank array BA4.

In some implementations, each of the plurality of bank arrays BA1 to BA32 may include a first region RG1 and a second region RG2. The first region RG1 and the second region RG2 may include a normal data region storing normal data and a metadata region storing metadata, respectively. For example, metadata corresponding to normal data stored in the normal data region of the first region RG1 may be stored in the metadata region of the second region RG2, and metadata corresponding to normal data stored in the normal data region of the second region RG2 may be stored in the metadata region of the first region RG1.

The number of banks included in a bank group and the number of bank groups included in a single memory device may vary according to example embodiments.

Figure 5:
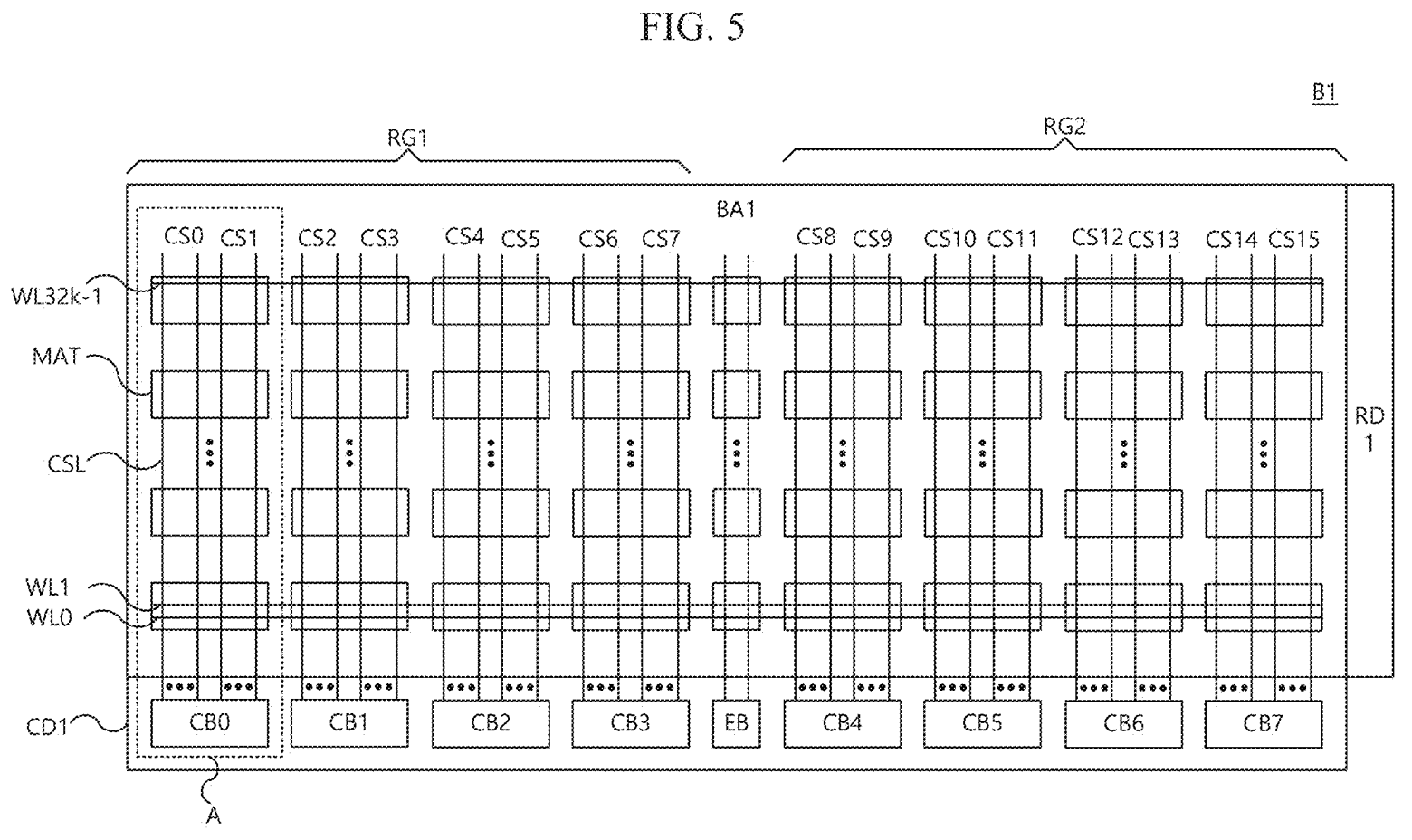
Figure 6:
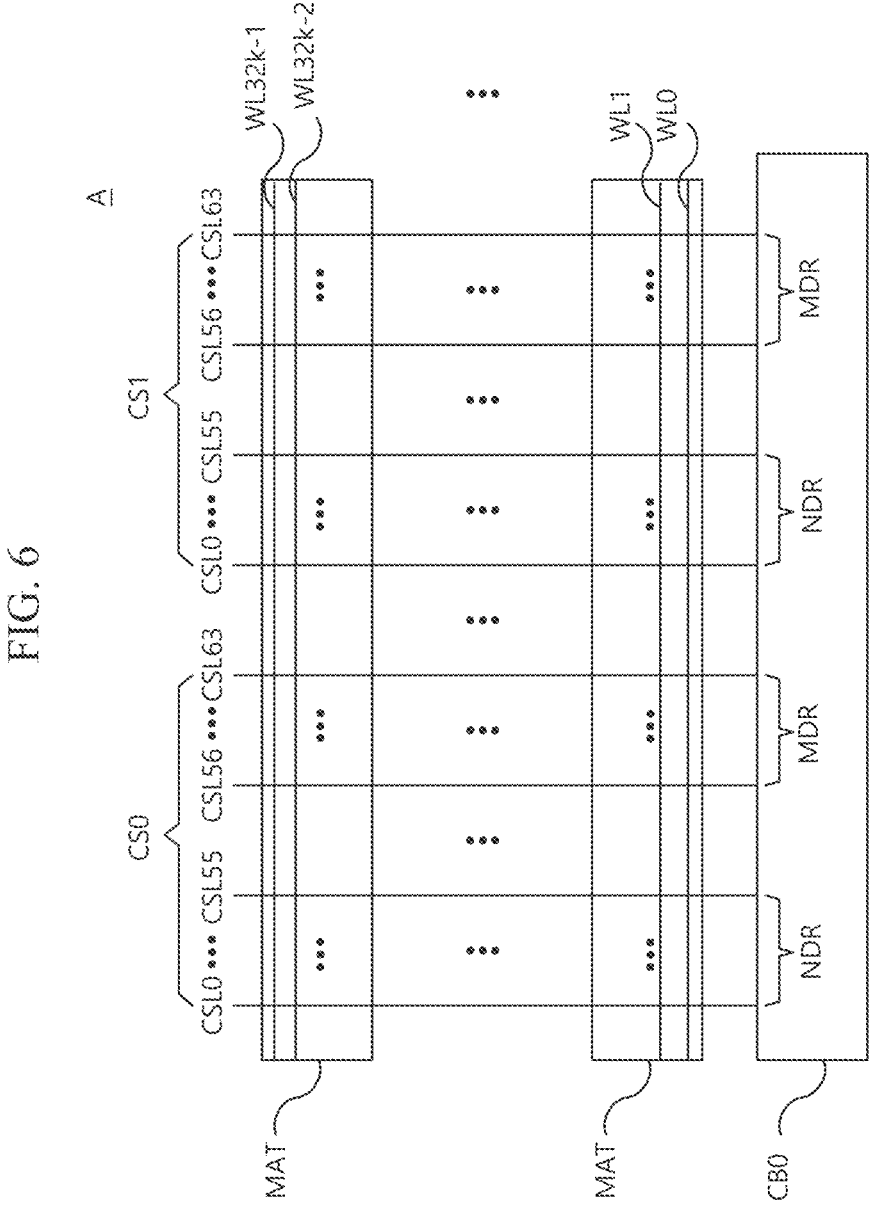
FIG. 6 is a detailed view of an example area "A" of FIG. 5 according to some implementations.

FIG. 5 is a diagram illustrating an example of a bank according to some implementations, and FIG. 6 is a detailed view of an example area "A" of FIG. 5 according to some implementations. The first bank B1 of FIG. 5 may correspond to one of the banks described in FIGS. 1 to 4. For ease of description, FIGS. 5 and 6 illustrate an example in which a ratio of normal data and metadata is 8:1.

In FIG. 5, a first bank B1 may include a first bank array BA1, a first row decoder RD1, and a first column decoder CD1. The first bank array BA1 may be divided into a first region RG1 and a second region RG2.

In some implementations, a length of the first region RG1 in a row direction and a length of the second region RG2 in the row direction may be the same. For example, a column select line extending in the column direction from an ECC block EB may be disposed in the center of the first bank array BA1, and the first bank array BA1 may be divided into the first region RG1 and the second region RG2 with respect to the column select line extending in the column direction from the ECC block EB. Accordingly, the number of column select lines corresponding to the first region RG1 and the number of column select lines corresponding to the second region RG2 may be the same. However, this is only an example, and the length of the first region RG1 in the row direction and the length of the second region RG2 in the row direction may be different from each other according to some implementations.

Each of the first region RG1 and the second region RG2 may include a plurality of mats MATs. Each of the plurality of mats MATs may be a mat to which a portion of wordlines and a portion of CSLs are connected. Each of the plurality of mats MATs may include a plurality of memory cells, and each of the plurality of memory cell may be connected to one of the portion of wordlines connected to a corresponding mat MAT and one of the portion of CSLs connected to the corresponding mat MAT.

The first column decoder CD1 may include a plurality of CSL blocks CB0 to CB7 and an ECC block EB. Each of the plurality of CSL blocks CB0 to CB7 may be configured to select a column select line to be activated, among the plurality of column select lines, based on a column address decoded by the first column decoder CD1.

In some implementations, each CSL block CB may correspond to two CSL groups CS. For example, the 0th CSL block CB0 may correspond to a 0th CSL group CS0 and a first CSL group CS1, and the first CSL block CB1 may correspond to a second CSL group CS2 and a third CSL group CS3. Similarly, the sixth CSL block CB6 may correspond to a twelfth CSL group CS12 and a thirteenth CSL group S13, and the seventh CSL block CB7 may correspond to a fourteenth CSL group CS 14 and a fifteenth CSL group CS15.

Each CSL group CS may include a plurality of column select lines. For example, each CSL group CS may include 64 column select lines. A portion of the 64 column select lines may be assigned to a normal data region, and another portion thereof select lines may be assigned to a metadata region.

An example of the 0th CSL block CB0 illustrated in FIG. 6 will now be described in more detail. The 0th CSL block CB0 may be connected to a 0th CSL group CS0 and a first CSL group CS1. The 0th CSL group CS0 may include 0th to 63rd column select lines CSL0 to CSL63, and the CSL group CS1 may include 0th to 63rd column select lines CSL0 to CSL63. As a result, a total of 128 column select lines may be connected to the 0th CSL block CB0.

In the 0th CSL group CS0, the 0th to 55th column select lines CSL0 to CSL55 may be assigned to the normal data region NDR, and the remaining column select lines 56th to 63rd column select lines CSL56 to CSL63 may be assigned to the metadata region MDR. The 0th to 55th column select lines CSL0 to CSL55 of the 1st CSL group CS1 may be assigned to the normal data region NDR, and the remaining 56th to 63rd column select lines CSL56 to CSL63 may be assigned to the metadata region MDR. As described above, a portion of the column select lines of each CSL group CS may be assigned to the normal data region NDR and another portion thereof may be assigned to the metadata region MDR.

In FIG. 5, a single column select line may be selected from a single CSL group CS and activated during a single access operation. Since two CSL groups CS correspond to one CSL block CB, one or two column select lines may be selected by a single CSL block CB during a single access operation.

The example described with respect to the 0th CSL block CB0 illustrated in FIG. 6 may also apply to any one of the blocks CB1 to CB7 shown in FIG. 5.

For example, the 4th CSL block CB4 may be connected to the 8th CSL group CS8 and the 9th CSL group CS9. The 8th CSL group CS8 may include 0th to 63rd column select lines CSL0 to CSL63, and the 9th CSL group CS9 may include 0th to 63rd column select lines CSL0 to CSL63. As a result, a total of 128 column select lines may be connected to the 4th CSL block CB0.

In the 8th group, the 0th to 55th column select lines CSL0 to CSL55 may be assigned to the normal data region NDR, and the remaining column select lines 56th to 63rd column select lines CSL56 to CSL63 may be assigned to the metadata region MDR. The 0th to 55th column select lines CSL0 to CSL55 of the 9th CSL group CS9 may be assigned to the normal data region NDR, and the remaining 56th to 63rd column select lines CSL56 to CSL63 may be assigned to the metadata region MDR. As described above, a portion of the column select lines of each CSL group CS may be assigned to the normal data region NDR and another portion thereof may be assigned to the metadata region MDR.

In some implementations, the first region RG1 and the second region RG2 may store normal data and metadata, respectively. For example, first metadata corresponding to the first normal data stored in the normal data region NDR of the first region RG1 may be stored in the metadata region MDR of the second region RG2. For example, second metadata corresponding to the second normal data stored in the normal data region NDR of the second region RG2 may be stored in the metadata region MDR of the first region RG1.

In other words, in some implementations, each of the plurality of first mats MATs included in the first region RG1 may correspond to two CSL groups (e.g. CS0, CS1 or CS2, CS3 or CS4, CS5 or CS6, CS7). Each of the plurality of second mats MATs included in the second region RG2 may correspond to two CSL groups (e.g. CS8, CS9 or CS10, CS11 or CS12, CS13 or CS14, CS15). Each of the two CSL groups (e.g. CS0, CS1 or CS2, CS3 or CS4, CS5 or CS6, CS7) corresponding to the plurality of first mats MATs may comprise first column select lines (e.g. CSL0 to CSL55) assigned to store the first normal data Normal Data 1, and second column select lines (e.g. CSL56 to CSL63) assigned to store the second metadata Meta Data 2. Each of the two CSL groups (e.g. CS8, CS9 or CS10, CS11 or CS12, CS13 or CS14, CS15) corresponding to the plurality of second mats MATs may comprise third column select lines (e.g. CSL0 to CSL55) assigned to store the second normal data Normal Data 2, and comprises fourth column select lines (e.g. CSL56 to CSL63) assigned to store the first metadata Meta Data 1.

In some implementations, the first region RG1 and the second region RG2 may be simultaneously activated during a write operation or a read operation. For example, during a write operation, the first normal data and the first metadata corresponding to the first normal data may be stored in the first region RG1 and the second region RG2, respectively. In some implementations, the column select lines of the first region RG1 corresponding to the first normal data and the column select lines of the second region RG2 corresponding to the first metadata may be simultaneously activated. Accordingly, the first normal data and the corresponding first metadata may be input together.

For example, during a read operation, the first normal data and the first metadata corresponding to the first normal data may be read from the first region RG1 and the second region RG2, respectively. In some implementations, the column select lines of the first region RG1 corresponding to the first normal data and the column select lines of the second region RG2 corresponding to the first metadata may be simultaneously activated. Accordingly, the first normal data and the corresponding first metadata may be output together.

As described above, the metadata may be input and output in one region of the first bank array BA1 while the normal data is input and output in another region of the first bank array BA1, and thus metadata mode may be efficiently performed.

In FIGS. 5 and 6, the first bank array BA1 has been described as including 16 CSL groups each including 64 column select lines. However, it should be understood that this is only an example and some implementations may not be limited thereto. The number of CSL groups included in each bank array and the number of column select lines included in each CSL group may be set variously according to example embodiments.

Hereinafter, the operation of a memory device according to an example embodiment will be described in more detail. FIGS. 7A to 14B are detailed views illustrating an example of a read operation of a bank according to some implementations. In some implementations, the bank of FIGS. 7A to 14B may correspond to the memory device of FIGS. 1 to 6.

For ease of description, an example is provided in which a ratio of normal data and corresponding metadata is 8:1. Also, an example is provided in which a single column select line corresponds to eight bitlines and a bit-width per channel is 32 bits. Also, an example is provided in which indices IDs of 0th, first, second, third, fourth, fifth, sixth, and seventh CSL groups CS0, CS1, CS2, CS3, CS4, CS5, CS6, and CS7 of a first region RG1 are 1, 3, 5, 7, 9, 11, 13, and 15, respectively, and indices IDs of eighth, ninth, tenth, eleventh, twelfth, thirteenth, fourteenth, and fifteenth CSL groups CS8, CS9, CS10, CS11, CS12, CS13, CS14, and CS15 of a second region RG2 are 0, 2, 4, 6, 8, 10, 12, and 14, respectively. Also, ease of description, an example will be provided in which a 0th wordline WL0 is activated.

In the following description, a coding value for normal data will be represented as 'CSLx_Left' or 'CSLx_Right,' where 'x' may refer to the number of column select line, and 'Left' may refer to the first region RG1 and 'Right' may refer to the second region RG2. In addition, a coding value for metadata will be represented as 'MCSLi<j>,' where 'I' may refer to the number of column select line and 'j' may refer to an index ID of a CSL group.

Figure 7B:
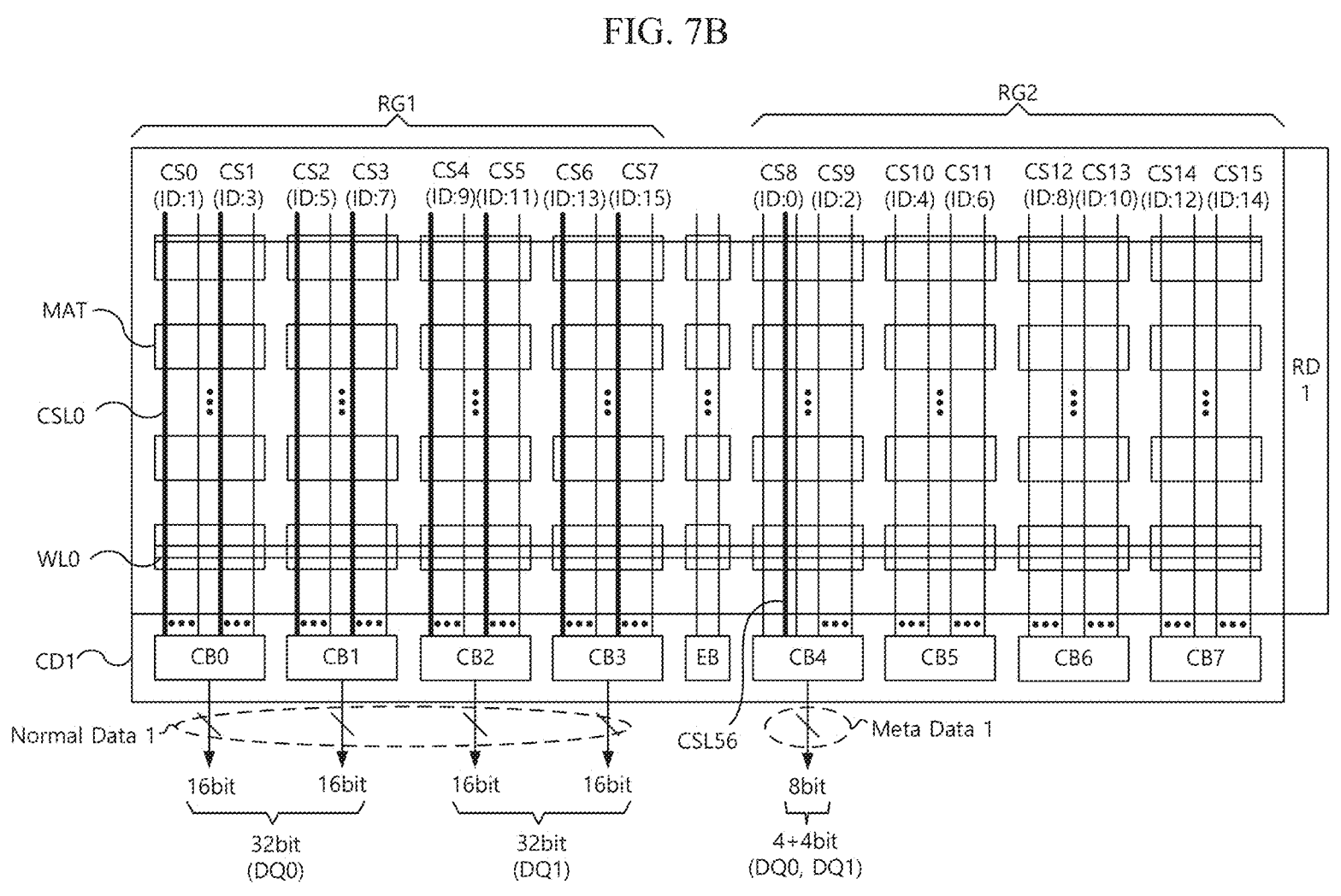
Figure 7C:
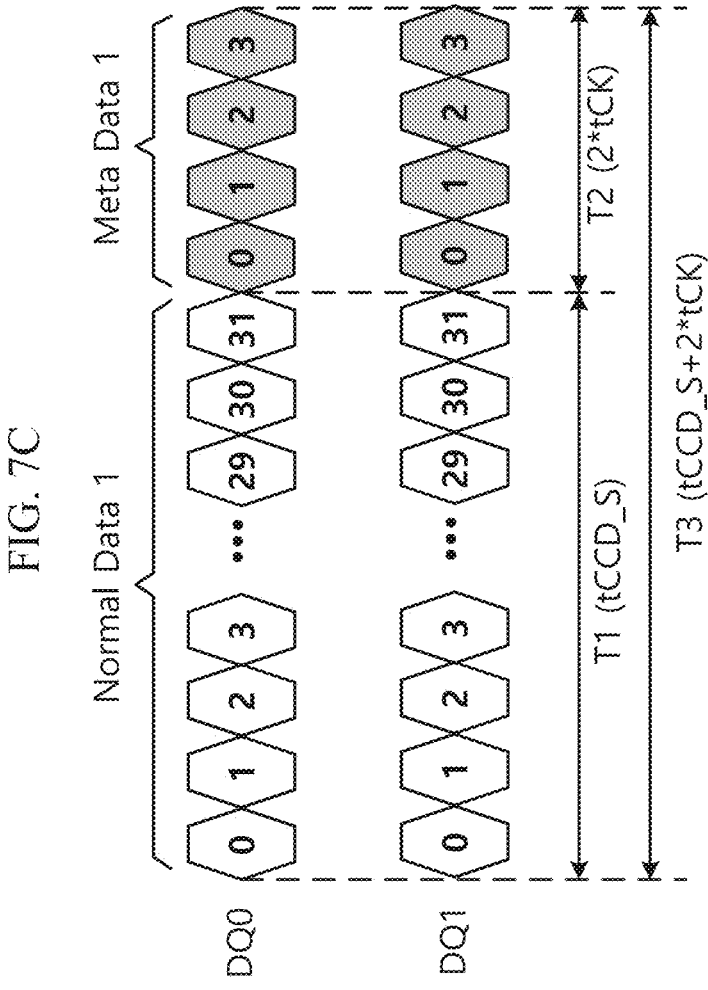

FIGS. 7A to 7C illustrate an example of a read operation on first normal data stored in the first region RG1 and first metadata stored in the second region RG2 according to some implementations. The first metadata may be metadata for the first normal data.

In FIGS. 7A and 7B, a coding value for normal data may be 'CSL0_Left.' Accordingly, the first region RG1 may be selected and 0th column select lines CSL0 included in the selected first region RG1 may be activated, as illustrated in the drawings. For example, the 0th column select line CSL0 may be activated in each of 0th to seventh CSL groups CS0 to CS7 included in the first region RG1.

Each CSL block CB corresponds to two CSL groups CS, so that each of the 0th to third CSL blocks CB0 to CB3 may activate two 0th column select lines CSL0. The two column select lines activated by each CSL block CB may be referred to as a 'CSL subset.' In some implementations, a single column select line is electrically connected to eight bitlines, so that each of the 0th to third CSL blocks CB0 to CB3 may output 16 bits of data. As a result, a total of 64 bits of the first normal data may be output.

In some implementations, when the bit-width per channel is implemented as 32 bits, two CSL blocks CB may correspond to a single channel or I/O pin. Accordingly, the first normal data may be output to the outside through two I/O pins. For example, data corresponding to the 0th and first CSL blocks CB0 and CB1 of the first normal data may be output to the outside through a 0th I/O pin DQ0, and data corresponding to the second and third CSL blocks CB2 and CB3 of the first normal data may be output to the outside through a first I/O pin DQ1. However, this is only an example and some implementations may not be limited thereto. The bit-width per channel may be implemented or set in various ways according to some implementations.

In some implementations, the bit-width per channel may be implemented as 16 bits. In some implementations, a single CSL block CB may correspond to a single channel or I/O pin. For example, data corresponding to the 0th to third CSL blocks CB0 to CB3 of the first normal data may be output to the outside through each of the 0th to third I/O pins DQ0 to DQ3, respectively.

In some implementations, the bit-width per channel may be implemented as 64 bits. In some implementations, four CSL blocks CB may correspond to a single channel or I/O pin. For example, first normal data corresponding to the 0th to third CSL blocks CB0 to CB3 may be output to the outside through a single I/O pin (for example, DQ0).

In FIGS. 7A and 7B, the coding value for metadata may be 'MCSL56<0>.' Accordingly, an eighth CSL group CS8 of the second region RG2 having an index (ID) value of '0' may be selected, and a 56th column select line CSL56 may be activated in the selected eighth CSL group CS8.

In some implementations, a single column select line is electrically connected to 8 bitlines, so that the fourth CSL block CB4 may output 8 bits of the first metadata.

In some implementations, when the bit-width per channel is implemented as 32 bits, the first normal data may correspond to two I/O pins. In some implementations, the first metadata may be output to the outside through two I/O pins in units of 4 bits. For example, 4 bits of the first metadata may be output to the outside through the 0th I/O pin DQ0, and another 4 bits of the first metadata may be output to the outside through the 1st I/O pin DQ1.

In some implementations, when the bit-width per channel is implemented as 16 bits, the first normal data may correspond to four I/O pins. In some implementations, the first metadata may be output to the outside through four I/O pins in units of 2 bits.

In some implementations, when the bit-width per channel is implemented as 64 bits, the first normal data may correspond to a single I/O pin. In some implementations, the first metadata may be output to the outside through a single I/O pin in units of 8 bits.

In FIG. 7C, the first normal data may be output to the outside through the 0th and the first data pins DQ0 and DQ1 during first time T1. The first time T1 may be less than or equal to command transmission time 'tCCD_s' between banks belonging to different bank groups.

The first metadata may be output to the outside through the 0th and first data pins DQ0 and DQ1 during second time T2. In some implementations, the first metadata may be consecutively output after the first normal data is output. The first metadata is output to the outside in units of 4 bits, so that the second time T2 may correspond to two clock times tCK.

The third time T3, during which the first normal data and the corresponding first metadata are output to the outside, may correspond to 'tCCD_s+2*tCK,' which means that there is no or very little time loss when the first normal data and the first metadata are output. As a result, according to some implementations, metadata mode may be efficiently performed without degradation of performance.

According to some implementations, the first metadata may be output to the outside through an additional data pin other than the 0th and first data pins DQ0 and DQ1. In some implementations, the first normal data and the first metadata may be output to the outside together.

According to some implementations, the first metadata may be output to the outside through the 0th and first data pins DQ0 and DQ1, and the first normal data may then be output to the outside through the 0th and first data pins DQ0 and DQ1.

Figure 8B:
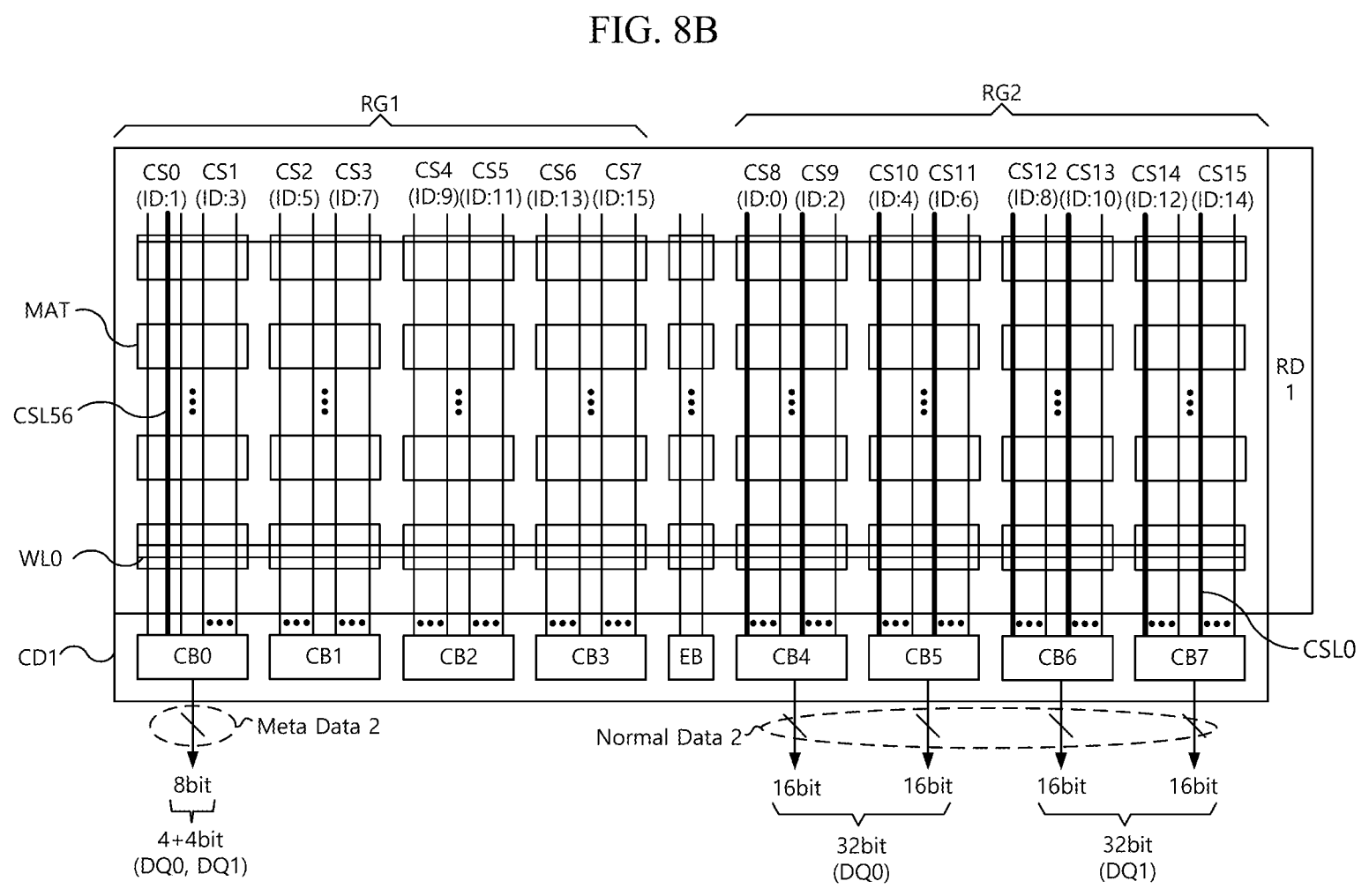

FIGS. 8A and 8B illustrate an example of a read operation on second normal data stored in the second region RG2 and second metadata stored in the first region RG1 according to some implementations. The second metadata may be metadata corresponding to the second normal data.

In FIGS. 8A and 8B, a coding value for normal data may be 'CSL0_Right.' Accordingly, the second region RG2 may be selected and the 0th column select lines CSL0 included in the selected second region RG2 may be activated, as illustrated in the drawings. For example, the 0th column select line CSL0 may be activated in each of the eighth to fifteenth CSL groups CS8 to CS15 included in the second region RG2.

Each CSL block CB corresponds to two CSL groups CS, so that each of the fourth to seventh CSL blocks CB4 to CB7 may activate two 0th column select lines CSL0. In some implementations, a single column select line is electrically connected to 8 bitlines, so that each of the fourth to seventh CSL blocks CB4 to CB7 may output 16 bits of data. As a result, a total of 64 bits of the first normal data may be output.

In some implementations, when the bit-width per channel is implemented as 32 bits, two CSL blocks CB may correspond to a single channel or I/O pin. Accordingly, the second normal data may be output to the outside through two I/O pins. For example, data corresponding to the fourth and fifth CSL blocks CB4 and CB5 of the second normal data may be output to the outside through the 0th I/O pin DQ0, and data corresponding to the sixth and seventh CSL blocks CB6 and CB7 of the second normal data may be output to the outside through the first I/O pin DQ1. However, this is only an example and some implementations are not limited thereto. As described in FIGS. 7A to 7C, the bit-width per channel may be implemented or set in various ways according to some implementations.

In FIGS. 8A and 8B, a coding value for metadata may be 'MCSL56<1>.' Accordingly, the 0th CSL group CS0 of the first region RG1 having an index (ID) value of '1' may be selected, and a 56th column select line CSL56 in the selected 0th CSL group CS0 may be activated.

In some implementations, a single column select line is electrically connected to 8 bitlines, so that the 0th CSL block CB0 may output 8 bits of the second metadata.

In some implementations, when the bit-width per channel is implemented as 32 bits, the second normal data may correspond to two I/O pins. In some implementations, the second metadata may be output to the outside through two I/O pins in units of 4 bits. For example, 4 bits of the second metadata may be output to the outside through the 0th I/O pin DQ0, and another 4 bits of the second metadata may be output to the outside through the first I/O pin DQ1. However, this is only an example, and the bit-width per channel may be implemented or set in various ways according to some implementations.

In some implementations, the second metadata may be consecutively output after the second normal data is output. For example, the second normal data may be output to the outside through the 0th and first data pins DQ0 and DQ1 during first time T1 (see FIG. 7C). The second metadata may be output to the outside through the 0th and first data pins DQ0 and DQ1 during second time T2 (see FIG. 7C). Third time period T3 (see FIG. 7C), during which the second normal data and the corresponding second metadata are output to the outside, may corresponds to 'tCCD_s+2*tCK.' As a result, the metadata mode may be efficiently performed without degradation of performance.

Figure 9B:
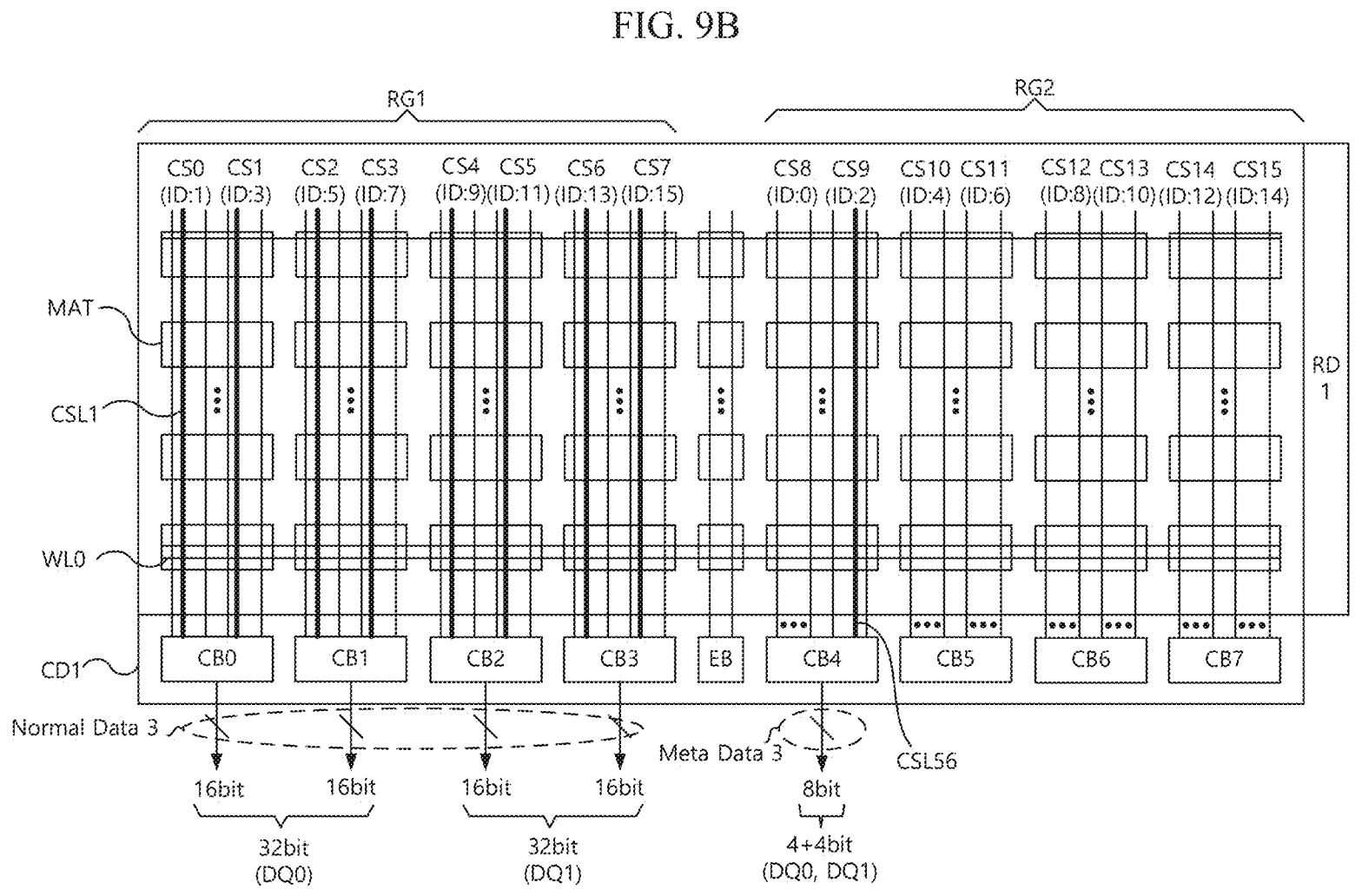

FIGS. 9A and 9B illustrate an example of a read operation on third normal data stored in a first region RG1 and third metadata stored in a second region RG2 according to some implementations. Third metadata may be metadata for the third normal data.

In FIGS. 9A and 9B, a coding value for normal data may be 'CSL1_Left.' Accordingly, as illustrated in the drawings, the first region RG1 may be selected, and first column select lines CSL1 included in the selected first region RG1 may be activated.

In some implementations, a single column select line is electrically connected to 8 bitlines, so that each of the 0th to third CSL blocks CB0 to CB3 may output 16 bits of data. As a result, a total of 64 bits of the third normal data may be output.

In some implementations, when the bit-width per channel is implemented as 32 bits, the third normal data may be output to the outside through two I/O pins. For example, data corresponding to the 0th and first CSL blocks CB0 and CB1 of the third normal data may be output to the outside through a 0th I/O pin DQ0, and data corresponding to the second and third CSL blocks CB2 and CB3 of the third normal data may be output to the outside through a first I/O pin DQ1. However, this is only an example and some implementations are not limited thereto. As described in FIGS. 7A to 7C, the bit-width per channel may be implemented or set in various ways according to some implementations.

In FIGS. 9A and 9B, a coding value for metadata may be 'MCSL56<2>.' Accordingly, a ninth CSL group CS9 of the second region RG2 having an index (ID) value of '2' may be selected, and a 56th column select line CSL56 may be activated in the selected ninth CSL group CS9. In this case, a single column select line is electrically connected to 8 bitlines, so that the fourth CSL block CB4 may output 8 bits of the third metadata.

In some implementations, when the bit-width per channel is implemented as 32 bits, the third metadata may be output to the outside through two I/O pins in units of 4 bits. For example, 4 bits of the third metadata may be output to the outside through a 0th I/O pin DQ0, and another 4 bits of the third metadata may be output to the outside through a first I/O pin DQ1. However, this is only an example and the bit-width per channel may be implemented or set in various ways according to some implementations.

In some implementations, the third metadata may be consecutively output after the third normal data is output. Similarly to what was described above, the time it takes for the third normal data and the corresponding third metadata to be output to the outside may correspond to 'tCCD_s+2*tCK.' Accordingly, metadata mode may be efficiently performed without degradation of performance.

Figure 10B:
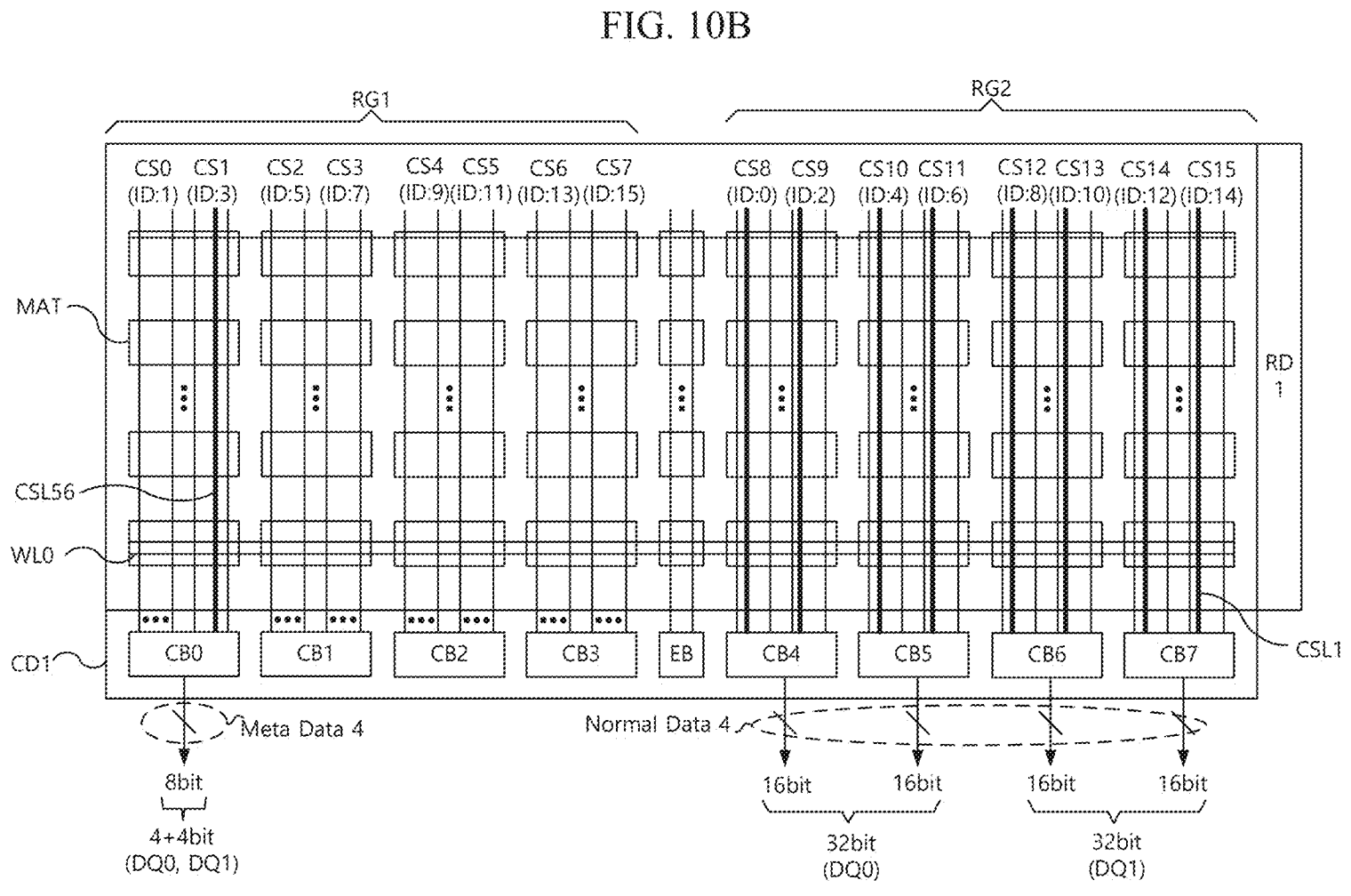

FIGS. 10A and 10B illustrate an example of a read operation on the fourth normal data stored in the second region RG2 and the fourth metadata stored in the first region RG1 according to some implementations. The fourth metadata may be metadata for the fourth normal data.

In FIGS. 10A and 10B, a coding value for normal data may be 'CSL1_Right.' Accordingly, as illustrated in the drawings, the second region RG2 may be selected, and the first column select lines CSL1 included in the selected second region RG2 may be activated. In some implementations, each of the fourth to seventh CSL blocks CB4 to CB7 may output 16 bits of data. As a result, a total of 64 bits of the fourth normal data may be output.

In some implementations, when the bit-width per channel is implemented as 32 bits, data corresponding to the fourth and fifth CSL blocks CB4 and CB5 of the fourth normal data may be output to the outside through a 0th I/O pin DQ0, and the data corresponding to the sixth and seventh CSL blocks CB6, CB7 of the fourth normal data may be output to the outside through a first I/O pin DQ1.

A coding value for metadata may be 'MCSL56<3>.' Accordingly, a first CSL group CS1 of the first region RG1 having an index (ID) value of '3' may be selected, and a 56th column select line CSL56 may be activated in the selected first CSL group CS1. In some implementations, a 0th CSL block CB0 may output 8 bits of the fourth metadata.

In some implementations, when the bit-width per channel is implemented as 32 bits, 4 bits of the fourth metadata may be output to the outside through the 0th I/O pin DQ0, and another 4 bits of the fourth metadata may be output to the outside through the first I/O pin DQ1.

The fourth metadata may be consecutively output after the fourth normal data is output. Similarly to that described above, the time it takes for the fourth normal data and the corresponding fourth metadata to be output to the outside may correspond to 'tCCD_s+2*tCK.' Accordingly, the metadata mode may be efficiently performed without degradation of performance.

In such a manner, read operation on fifth normal data and fifth metadata corresponding to 'CSL2_Left' and 'MCSL56' and read operation on sixth normal data and sixth metadata corresponding to 'CSL2_Right' and 'MCSL56,' or the like, may be performed, and a detailed description thereof will be omitted. Similarly, read operations may be performed on seventh to fourteenth normal data and corresponding seventh metadata to fourteenth metadata, and a detailed description thereof will be omitted.

Figure 11B:
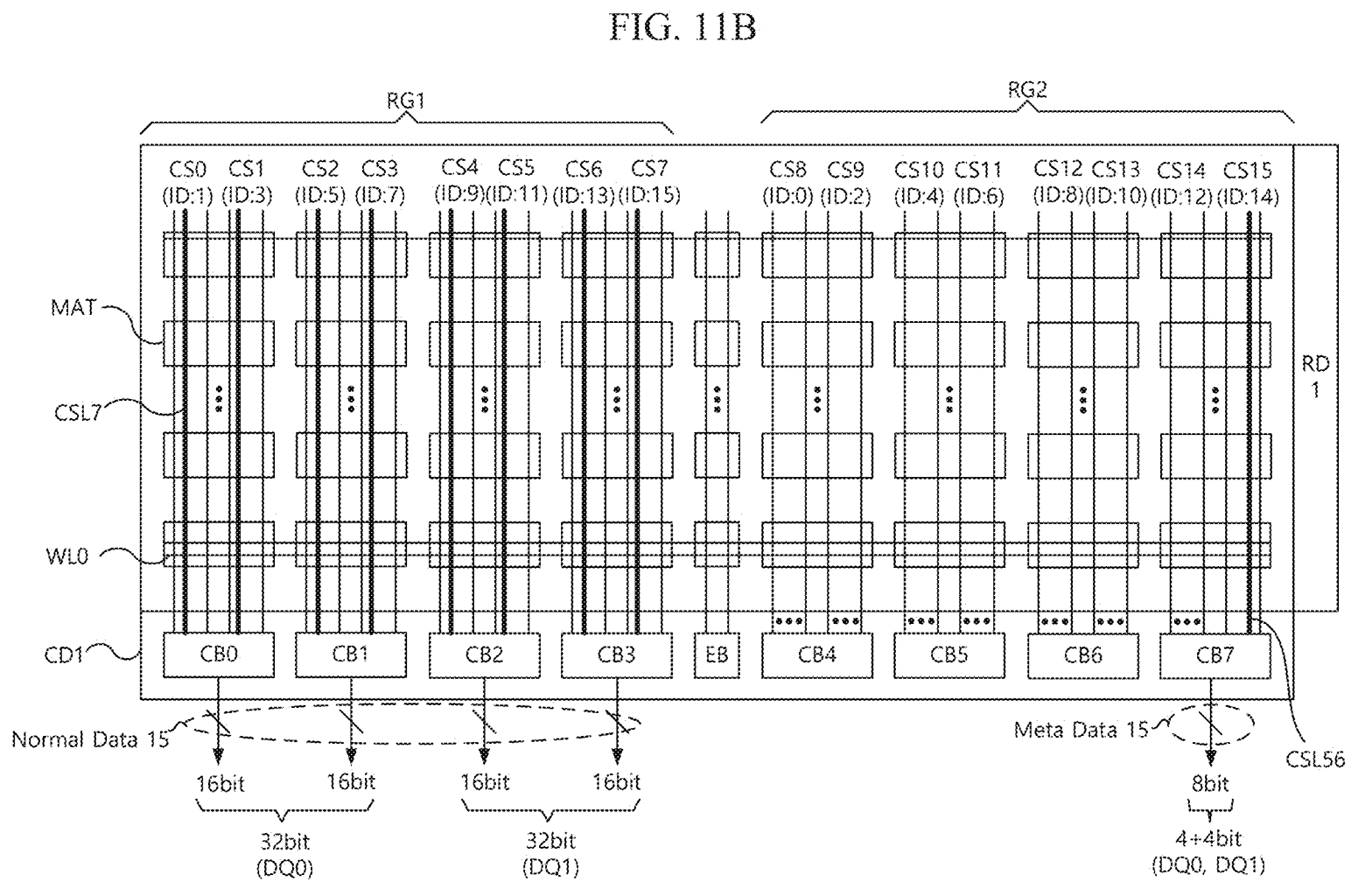

FIGS. 11A and 11B illustrate an example of a read operation on fifteenth normal data stored in the first region RG1 and fifteenth metadata stored in the second region RG2 according to some implementations. The fifteenth metadata may be metadata for the fifteenth normal data.

In FIGS. 11A and 11B, a coding value for normal data may be 'CSL7_Left.' Accordingly, as illustrated in the drawings, the first region RG1 may be selected, and seventh column select lines CSL7 included in the selected first region RG1 may be activated. In some implementations, each of the 0th to third CSL blocks CB0 to CB3 may output 16 bits of data. As a result, a total of 64 bits of the fifteenth normal data may be output.

In some implementations, when the bit-width per channel is implemented as 32 bits, data corresponding to 0th and first CSL blocks CB0 and CB1 of the fifteenth normal data may be output to the outside through a 0th I/O pin DQ0, and data corresponding to second and third CSL blocks CB2 and CB3 of the fifteenth normal data may be output to the outside through a first I/O pin DQ1.

A coding value for metadata may be 'MCSL56<14>.' Accordingly, a fifteenth CSL group CS15 of the second region RG2 having an index (ID) value of '14' may be selected, and a 56th column select line CSL56 may be activated in the selected fifteenth CSL group CS15. In an example embodiment, the seventh CSL block CB7 may output 8 bits of the fifteenth metadata.

In some implementations, when the bit-width per channel is implemented as 32 bits, 4 bits of the fifteenth metadata may be output to the outside through the 0th I/O pin DQ0, and another 4 bits of the fifteenth metadata may be output to the outside through the first I/O pin DQ1.

The fifteenth metadata may be consecutively output after the fifteenth normal data is output. Similar to that described above, the time it takes for the fifteenth normal data and the corresponding fifteenth metadata to be output to the outside corresponds to 'tCCD_s+2*tCK.' Accordingly, the metadata mode may be efficiently performed without degradation of performance.

Figure 12B:
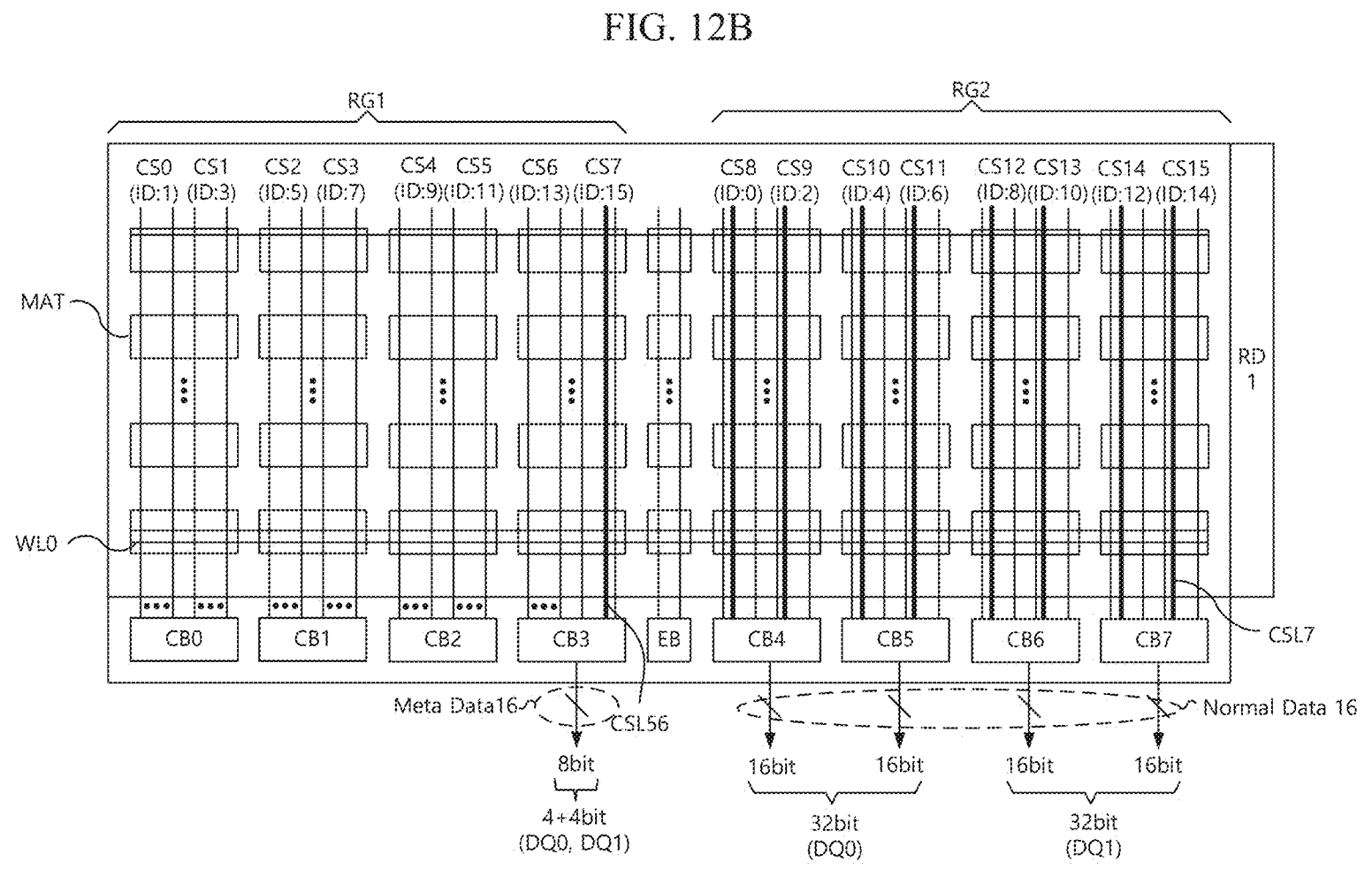

FIGS. 12A and 12B illustrate an example of a read operation on sixteenth normal data stored in the first region RG1 and sixteenth metadata stored in the second region RG2 according to some implementations. The sixteenth metadata may be metadata for the sixteenth normal data.

In FIGS. 12A and 12B, a coding value for normal data may be 'CSL7_Right.' Accordingly, as illustrated in the drawings, a second region RG2 may be selected, and seventh column select lines CSL7 included in the selected second region RG2 may be activated. In an example embodiment, each of the fourth to seventh CSL blocks CB4 to CB7 may output 16 bits of data. As a result, a total of 64 bits of the sixteenth normal data may be output.

In some implementations, when the bit-width per channel is implemented as 32 bits, data corresponding to fourth and fifth CSL blocks CB4 and CB5 of sixteenth normal data may be output to the outside through a 0th I/O pin DQ0, and data corresponding to sixth and seventh CSL blocks CB6 and CB7 of the sixteenth normal data may be output to the outside through a first I/O pin DQ1.

A coding value for metadata may be 'MCSL56.' Accordingly, a seventh CSL group CS7 of the first region RG1 having an index (ID) value of '15' may be selected, and a 56th column select line CSL56 may be activated in the selected seventh CSL group CS7. In some implementations, the third CSL block CB3 may output 8 bits of the sixteenth metadata.

In some implementations, when the bit-width per channel is implemented as 32 bits, 4 bits of the sixteenth metadata may be output to the outside through the 0th I/O pin DQ0, and another 4 bits of the sixteenth metadata may be output to the outside through the first I/O pin DQ1.

The sixteenth metadata may be consecutively output after the sixteenth normal data is output. Similar to that described above, the time it takes for the 16th normal data and the corresponding 16th metadata to be output to the outside may correspond to 'tCCD_s+2*tCK.' Accordingly, metadata mode may be efficiently performed without degradation of performance.

In FIGS. 7A to 12B, normal data may correspond to the 0th to 7th column select lines CSL0 to CSL7 of the first region RG1, and metadata for the normal data may correspond to the 56th column select line CSL56 of the second region RG2. Also, normal data may correspond to the 0th to 7th column select lines CSL0 to CSL7 of the second region RG2, and metadata for the normal data may correspond to the 56th column select line CSL56 of the first region RG1.

In such a manner, normal data may correspond to the eighth to 55th column select lines CSL8 to CSL55 of the first region RG1, and metadata for the normal data may correspond to the 57th to 62nd column select lines CSL57 to CSL62 of the second region RG2. Also, normal data may correspond to the eighth to 55th column select lines CSL8 to CSL55 of the second region RG2, and metadata for the normal data may correspond to the 57th to 62nd column select lines CSL57 to CSL62 of the first region RG1.

Figure 13B:
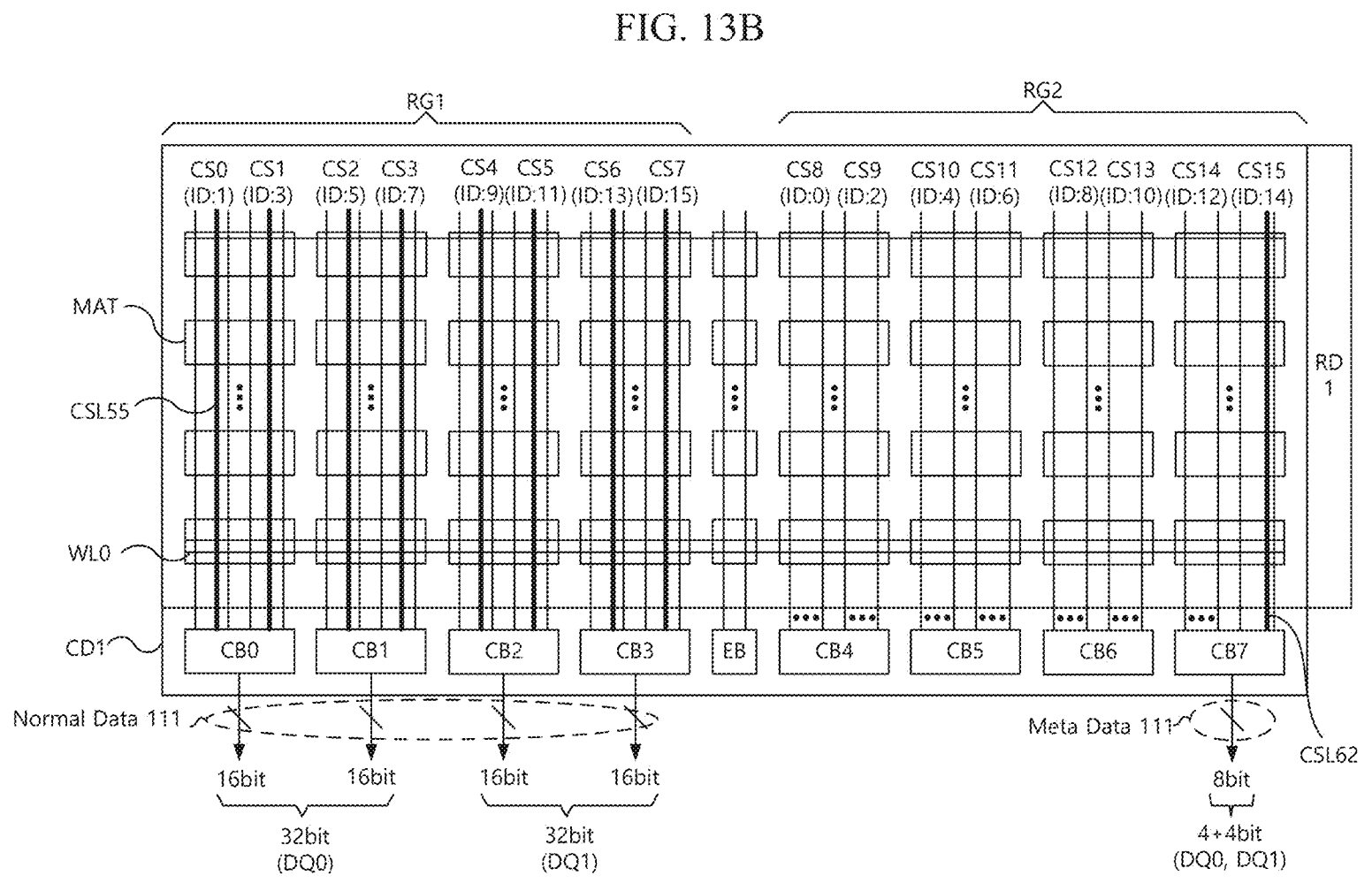

FIGS. 13A and 13B illustrate an example of a read operation on 111th normal data stored in a first region RG1 and 111th metadata stored in a second region RG2 according to some implementations. The 111th metadata may be metadata for the 111th normal data.

A coding value for the 111th normal data may be 'CSL55_Left.' Accordingly, as illustrated in the drawings, the first region RG1 may be selected, and a 55th column select lines CSL55 included in the selected first region RG1 may be activated. In some implementations, each of the 0th to third CSL blocks CB0 to CB3 may output 16 bits of data. Accordingly, a total of 64 bits of the 111th normal data may be output.

In some implementations, when the bit-width per channel is implemented as 32 bits, data corresponding to the 0th and first CSL blocks CB0 and CB1 of the 111th normal data may be output to the outside through the 0th I/O pin DQ0, and data corresponding to the second and third CSL blocks CB2 and CB3 of the 111th normal data may be output to the outside through the first I/O pin DQ1.

A coding value for metadata may be 'MCSL62<14>'. Accordingly, a fifteenth CSL group CS15 of the second region RG2 having an index (ID) value of '14' may be selected, and a 62nd column select line CSL62 may be activated in the selected fifteenth CSL group CS15. In some implementations, a seventh CSL block CB7 may output 8 bits of the 111th metadata.

In some implementations, when the bit-width per channel is implemented as 32 bits, 4 bits of the 111th metadata may be output to the outside through the 0th I/O pin DQ0, and another 4 bits of the 111th metadata may be output to the outside through the first I/O pin DQ1.

The 111th metadata may be consecutively output after the 111th normal data is output. Similar to that described above, the time it takes for the 111th normal data and the corresponding 111th metadata to be output to the outside may correspond to 'tCCD_s+2*tCK.' Accordingly, metadata mode may be efficiently performed without degradation of performance.

Figure 14B:
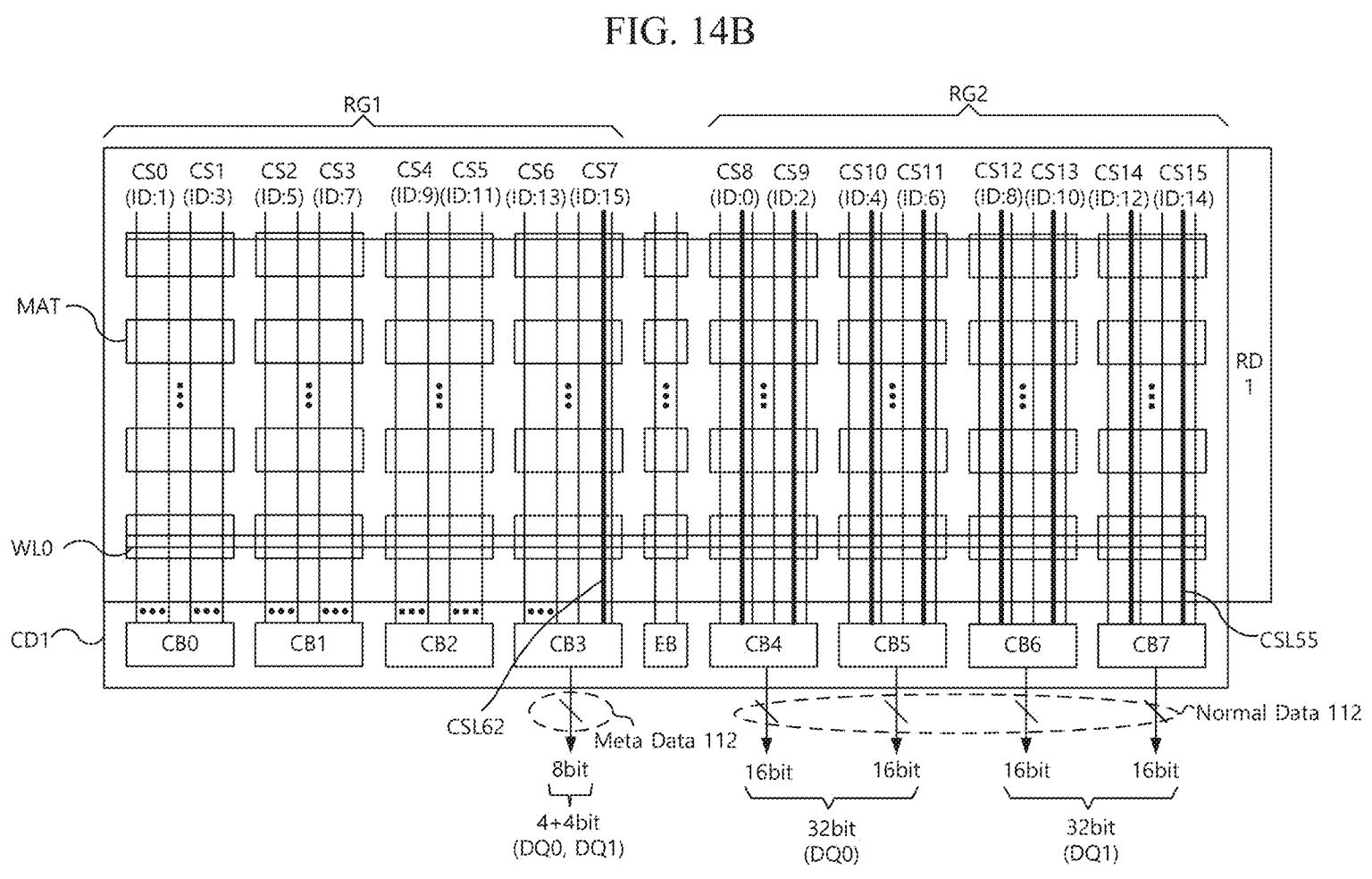

FIGS. 14A and 14B illustrate an example of read operations on 112th normal data stored in the second region RG2 and 112th metadata stored in the first region RG1 according to some implementations. The 112th metadata may be metadata for the 112th normal data.

A coding value for the 112th normal data may be 'CSL55_Right.' Accordingly, as illustrated in the drawings, the second region RG2 may be selected, and a 55th column select lines CSL55 included in the selected second region RG2 may be activated. In some implementations, each of the fourth to seventh CSL blocks CB4 to CB7 may output 16 bits of data. As a result, a total of 64 bits of the 112th normal data may be output.

In some implementations, when the bit-width per channel is implemented as 32 bits, data corresponding to the fourth and fifth CSL blocks CB4 and CB5 of the 112th normal data may be output to the outside through the 0th I/O pin DQ0, and data corresponding to the sixth and seventh CSL blocks CB6 and CB7 of the 112th normal data may be output to the outside through the first I/O pin DQ1.

A coding value for metadata may be 'MCSL62<15>.' Accordingly, a seventh CSL group CS7 of the first region RG1 having an index (ID) value of '15' may be selected, and a 62nd column select line CSL62 may be activated in the selected seventh CSL group CS7. In a some implementations, the third CSL block CB3 may output 8 bits of the 112th metadata.

In some implementations, when the bit-width per channel is implemented as 32 bits, 4 bits of the 112th metadata may be output to the outside through the 0th I/O pin DQ0, and another 4 bits of the 112th metadata may be output to the outside through the first I/O pin DQ1.

The 112th metadata may be consecutively output after the 112th normal data is output. Similar to that described above, the time it takes for the 112th normal data and the corresponding 112th metadata to be output to the outside may correspond to 'tCCD_s+2*tCK.' Accordingly, metadata mode may be efficiently performed without degradation of performance.

In FIGS. 7A to 14B, metadata for normal data stored in the first region RG1 may be stored in the second region RG2, and metadata for normal data stored in the second region RG2 may be stored in the first region RG1. Accordingly, the normal data and the metadata may be input/output together. As a result, metadata mode may be efficiently performed.

In FIGS. 7A to 14B, the 0th word line WL0 has been described as being activated. For example, both normal data and corresponding metadata have been described as being stored in memory cells connected to the same 0th word line WL0. However, this is only an example, and some implementations may be equally applied even when other word lines are activated. For example, during a write operation, the first word line WL1 may be activated, and the first normal data may be stored in the first region RG1 and the first metadata for the first normal data may be stored in the second region RG2. Also, the first word line WL1 may be activated, the second normal data may be stored in the second region RG2 and the second metadata for the second normal data may be stored in the first region RG1.

As described above, normal data and metadata for the normal data may correspond to the same wordline, so that the metadata may not be concentrated on a specific wordline. For example, the metadata may be stored and distributed to a plurality of wordlines. In some implementations, compared to the case in which metadata is concentrated and stored in a specific wordline, an intensive access to a specific wordline may be prevented to suppress the row hammer effect.

FIGS. 7A to 14B illustrated an example of a read operation in which normal data and corresponding metadata are read out together according to some implementations. However, it should be understood that this is only an example and some implementations are not limited thereto. For example, some implementations may also be applied to a write operation in which normal data and corresponding metadata are read together.

For example, according to some implementations first normal data Normal Data 1 and the first metadata Meta Data 1 may be configured to be output through a first data pin, and the second normal data Normal Data 2 and the second metadata Meta Data 2 may be configured to be output through a second data pin that is different from the first data pin.

For example, according to some implementations the first normal data Normal Data 1 and the first metadata Meta Data 1 may be configured to be sequentially output through the first data pin, and the second normal data Normal Data 2 and the second metadata Meta Data 2 are configured to be sequentially output through the second data pin.

For example, according to some implementations, the first normal data Normal Data 1 and the first metadata Meta Data 1 may be configured to be output through a first data pin and a second data pin, respectively, and the second normal data Normal Data 2 and the second metadata Meta Data 2 are configured to be output through a third data pin and a fourth data pin, respectively.

Figure 15A:
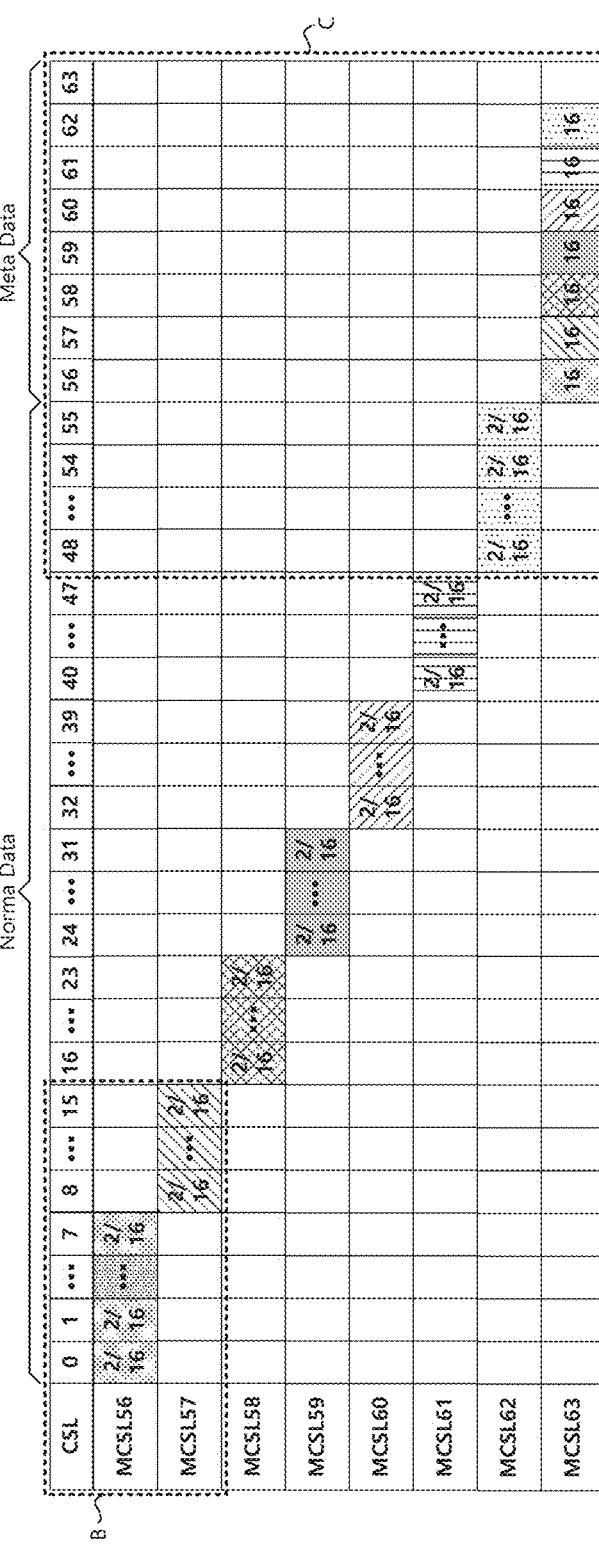

FIGS. 15A to 15C illustrate an example of assigning normal data and metadata for each column select line according to some implementations. For example, similarly to FIGS. 7A to 14C, an example is provided in which a ratio of normal data and metadata is 8:1.

In FIG. 15A, column select lines CSL0 to CSL55 0 to 55 may be assigned to store normal data. Column select lines CSL56 to CSL63 56 to 63 may be assigned to store metadata. Column select lines assigned to store metadata may be referred to as meta column select lines MCSL.

In some implementations, column select lines may be assigned such that a ratio of normal data and metadata is 8:1. For example, 8 or 8*N (where N is a positive integer) column select lines may be assigned to normal data, and 1 or 1*N column select lines may be assigned to metadata.

For example, 0th to seventh column select lines CSL0 to CSL7 may be assigned to store normal data, and a 56th meta column select line MCSL56 may be assigned to store metadata for the normal data. For example, eighth to fifteenth column select lines CSL8 to CSL15 may be assigned to store normal data, and a 57th meta column select line MCSL57 may be assigned to store metadata for the normal data. As described above, for example, 48th to 55th column select lines CSL48 to CSL55 may be assigned to store normal data, and a 62th meta column select line MCSL62 may be assigned to store metadata for the normal data.

In some implementations, each column select line assigned to store normal data may be divided into column select lines corresponding to the first region RG1 (see FIG. 7B) and column select lines corresponding to the second region RG2 (see FIG. 7B). Also, each meta column select line assigned to store metadata may be divided into column select lines corresponding to the first region RG1 and column select lines corresponding to the second region RG2. Metadata corresponding to normal data stored in the column select lines of the first region RG1 may be stored in the second region RG2, and metadata corresponding to normal data stored in the column select lines of the second region RG2 may be stored in the first region RG1.

For example, referring to FIGS. 15B and 15C, column select lines corresponding to the first region RG1 may have a low value L, and column select lines corresponding to the second region RG2 may have a high value H.

0th to seventh column select lines 0 to 7 CSL0 to CSL7 having a low value L may be assigned to store the first normal data, and the 56th meta column select line MCSL56 having a high value H may be assigned to store the first metadata corresponding to the first normal data. 0th to seventh column select lines 0 to 7 CSL0 to CSL7 having a high value H may be assigned to store the second normal data, and a 56th meta column select line MCSL56 having a low value L may be assigned to store the second metadata corresponding to the second normal data.

Similarly, eighth to fifteenth column select lines CSL8 to CSL15 having a low value L may be assigned to store third normal data, and a 57th meta column select line MCSL57 having a high value H may be assigned to store third metadata corresponding to third normal data. The eighth to fifteenth column select lines CSL8 to CSL15 having a high value H may be assigned to store fourth normal data, and the 57th meta column select line MCSL57 having a low L value may be assigned to store fourth metadata corresponding to the fourth normal data.

In such a manner, the 48th to 55th column select lines CSL48 to CSL55 having a low value L may be assigned to store thirteenth normal data, and the 62th meta column select line MCSL62 having a high value H may be assigned to store the 13th metadata corresponding to the 13th normal data. The 48th to 55th column select lines CSL48 to CSL55 having a high value H may be assigned to store fourteenth normal data, and the 62th meta column select line MCSL62 having a low value L may be assigned to store fourteenth metadata corresponding to the fourteenth normal data. The 63th meta column select line MCSL63 may be in an empty state in which no data is assigned.

Figure 16:
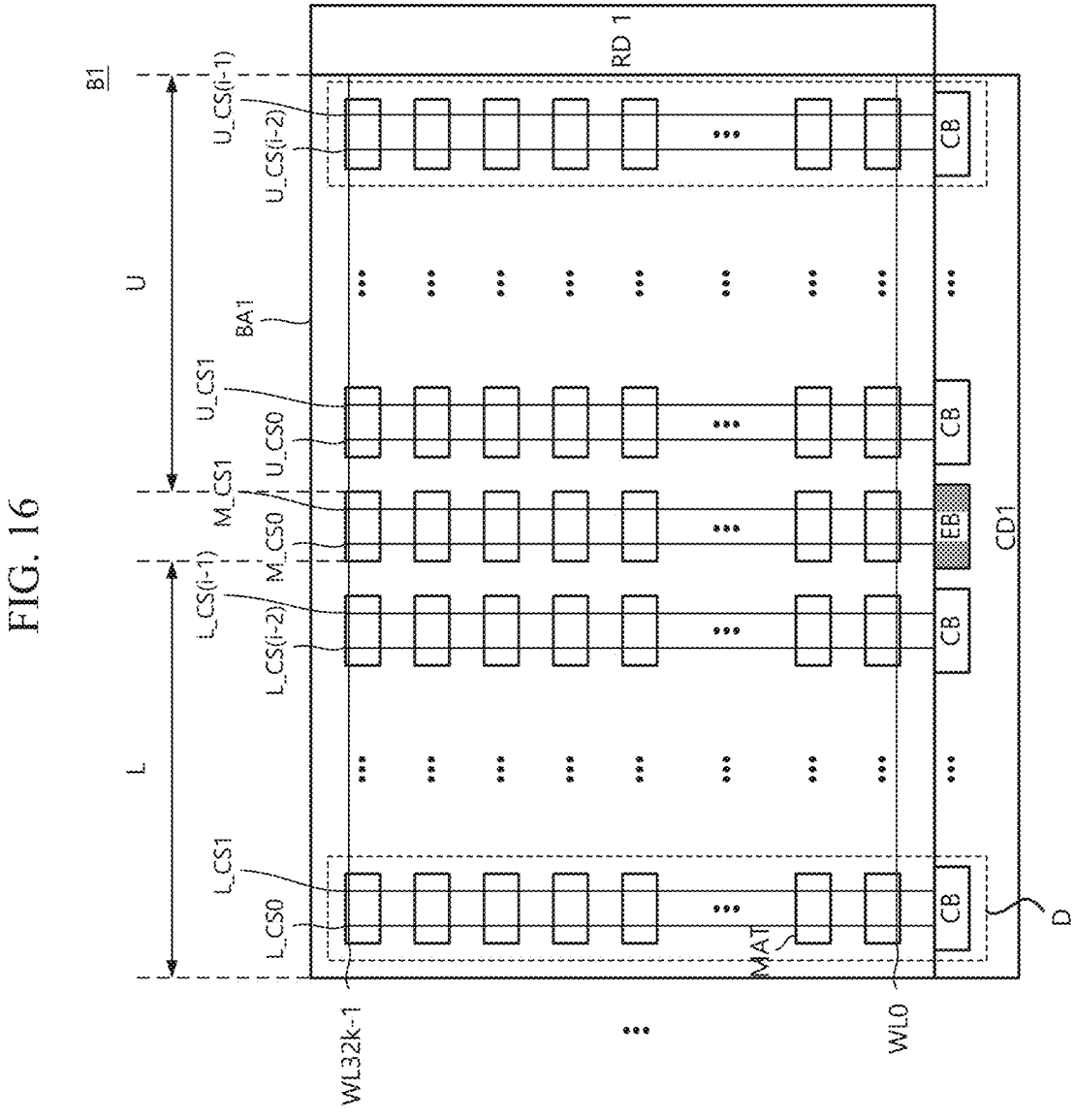
FIG. 16 is a drawing illustrating an example of a bank according to some implementations.
Figure 17:
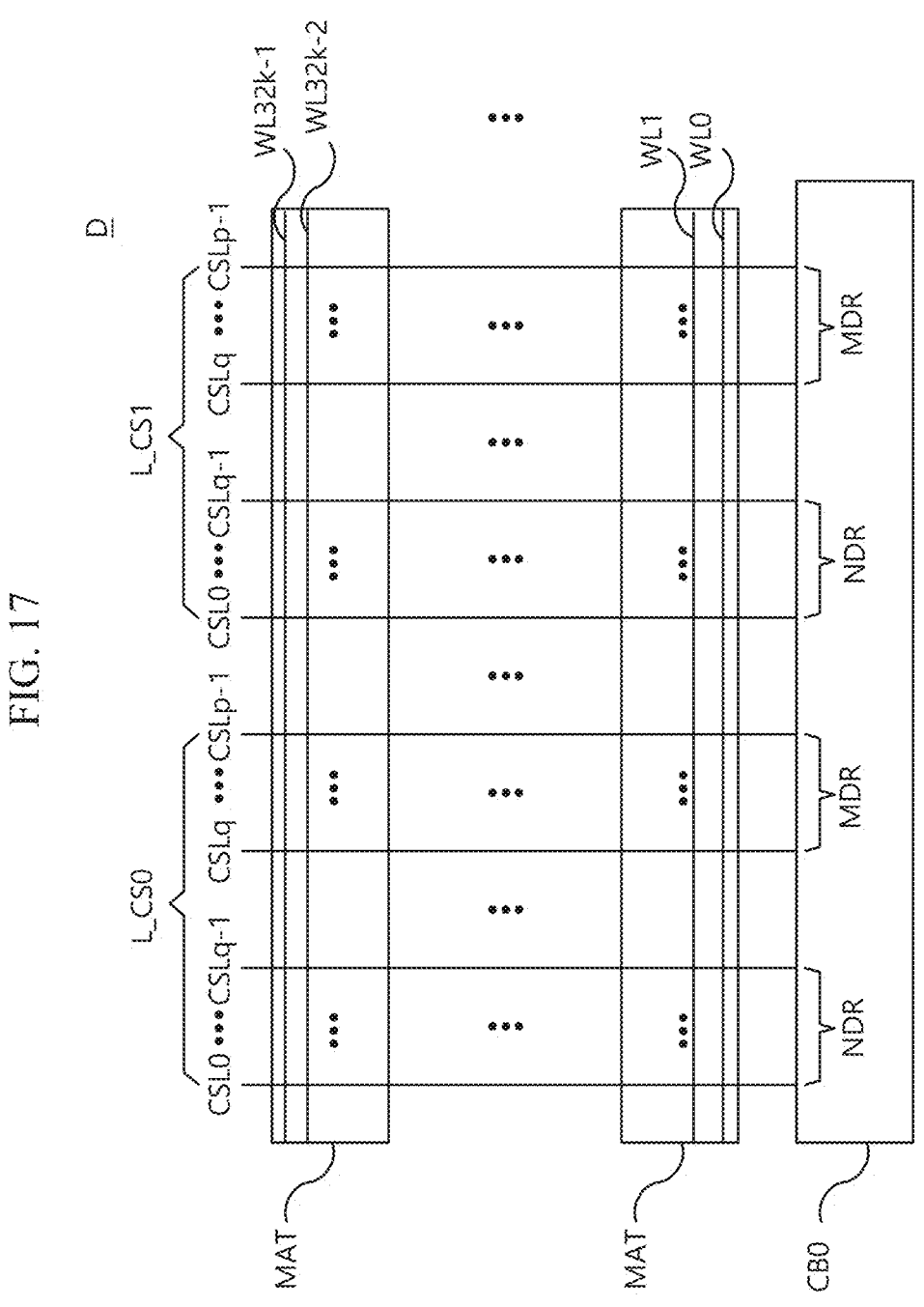
FIG. 17 is a detailed view of an example area "D" of FIG. 16 according to some implementations.

FIG. 16 is a drawing illustrating an example of a bank according to some implementations. FIG. 17 is a detailed view of an example area "D" of FIG. 16 according to some implementations. A bank B1 of FIG. 16 may correspond to one of the banks described in FIGS. 1 to 4.

In the above description, an example has been provided in which the ratio of normal data and metadata is 8:1. However, this is only an example and some implementations are not limited thereto. The ratio of normal data and metadata may be set in various ways according to some implementations.

In FIG. 21, a first bank B1 may include a first bank array BA1, a first row decoder RD1, and a first column decoder CD1. The first bank array BA1 may be electrically connected to the first row decoder RD1 and the first column decoder CD1. The first bank array BA1 may be connected to a plurality of wordlines WL1_0 to WL1_32$k$−1 through the first row decoder RD1. Also, the first bank array BA1 may be connected to a plurality of CSL subsets L_CS0 to U_CS(i−1), M_CS0, M_CS1, and U_CS0 to U_CS(i−1) through the first column decoder CD1.

Each of the first region RG1 and the second region RG2 may include a plurality of mats MATs. Each of the plurality of mats MATs may be connected to one of a portion of wordlines connected to a corresponding mat MAT and one of a portion of CSLs connected to the corresponding mat MAT.

The first column decoder CD1 may include a plurality of CSL blocks CB and a single ECC block EB. Each of the CSL blocks CB and the ECC block EB may be configured to select a column select line based on a column address decoded from the first column decoder CD1. For example, mats MATs connected to a column corresponding to the ECC block EB may store parity bits generated from the ECC block EB.

In some implementations, the ECC block EB may be disposed to correspond to a center column select line among the plurality of column select lines included in the first bank array BA1. For example, a plurality of CSL blocks CB may be disposed to be symmetrical with respect to the ECC block EB. Accordingly, column select lines connected to the plurality of CSL blocks CB may be disposed to be symmetrical with respect to the column select lines M_CS0 and M_CS1 connected to the ECC block EB.

A plurality of CSL groups L_CS0 to LCS(i−1) (where i is a positive integer) may be disposed on a first side L and a plurality of CSL groups U_CS0 to ULCS(i−1) (where i is a positive integer) may be disposed on a second side U, with respect to the ECC block EB.

In some implementations, each CSL group CS may include a plurality of column select lines. For example, as illustrated in FIG. 17, the 0th CS group L_CS0 on the first side may include a plurality of column select lines CSL0 to CSLp−1 (where p is a positive integer), and the first CS group L_CS1 on the first side may include a plurality of column select lines CSL0 to CSLp−1 (where p is a positive integer).

In some implementations, the first side L of FIG. 16 may correspond to the first region RG1 of FIG. 5, and the second side U of FIG. 16 may correspond to the second region RG2 of FIG. 5. For example, metadata for normal data stored on the first side L may be stored on the second side U, and metadata for normal data stored on the second side U may be stored on the first side L. According to some implementations, values of I, p, and k may be adjusted in various ways, and the ratio of normal data and metadata may also be adjusted in various ways.

FIGS. 18 and 19 are diagrams illustrating an example of a memory module according to some implementations. In FIGS. 18 and 19, a memory module 1000A or 1000B may include a plurality of memory devices 101 to 120 and a register clock driver (RCD) 150. The plurality of memory devices 101 to 120 may be disposed to the left and right with respect to the register clock driver 150.

The memory module 1000A or 1000B may be a dual in-line memory module (DIMM) conforming to the JEDEC standard. For example, the memory module 1000A may be a registered DIMM (RDIMM), a load reduced DIMM (LRDIMM0, an unbuffered DIMM (UDIMM), a fully buffered DIMM (FB-DIMM), a small outline DIMM (SO-DIMM), or another memory module such as a single in-line memory module (SIMM).

Each of the memory devices 101 to 120 may be a memory device 200 described in FIGS. 1 to 17. The memory devices 101 to 120 may be various DRAM devices, such as a double data rate synchronous dynamic random access memory (DDR SDRAM) device, a low power double data rate (LPDDR) SDRAM device, or a graphics double data rate synchronous graphics random access memory (GDDR SGRAM) device. In some implementations, each of the memory devices 101 to 120 may be an SRAM device, a NAND flash memory device, a NOR flash memory device, an RRAM device, an FRAM device, a PRAM device, a TRAM device, an MRAM device, or the like. The types of memory devices 101 to 120 may be the same or different from each other.

The number of memory devices 101 to 120 included in the memory module 1000A or 1000B is an example, and the number of the memory devices 101 to 120 may be determined based on the memory capacity provided to a user and the capacity of each of the memory devices 101 to 120.

According to some implementations, the plurality of memory devices 101 to 120 may share a transmission path for a clock CK, a command CMD, an address signal ADDR, a data signal DQ, and a data strobe signal DQS, as illustrated in FIG. 18.

In some implementations, the register clock driver 150 may the receive clock CK, the command CMD, the address ADDR, the data signal DQ, and the data strobe signal DQS from the memory controller 100 (see FIG. 1). The register clock driver 150 may control the memory devices 101 to 120 based on the clock CK, the command CMD, the address ADDR, the data signal DQ, and the data strobe signal DQS. The register clock driver 150 may serve as a buffer for the clock CK, the command CMD, the address ADDR, the data signal DQ, and the data strobe signal DQS.

According to some implementations, the plurality of memory devices 101 to 120 may share transmission paths for a clock CK, a command CMD, and an address signal ADDR, but may not share a transmission path for a data signal DQ and a data strobe signal DQS, as illustrated in FIG. 19. For example, each of the plurality of memory devices 101 to 120 may independently receive the data signal DQ and the data strobe signal DQS from the memory controller 100 (see FIG. 1). Accordingly, the memory controller 100 may independently set operating modes of each of the plurality of memory devices 101 to 120.

In some implementations, the register clock driver 150 may receive the clock CK, the command CMD, and the address ADDR from the memory controller 100. The register clock driver 150 may serve as a buffer for the clock CK, the command CMD, and the address ADDR.

Figure 20:
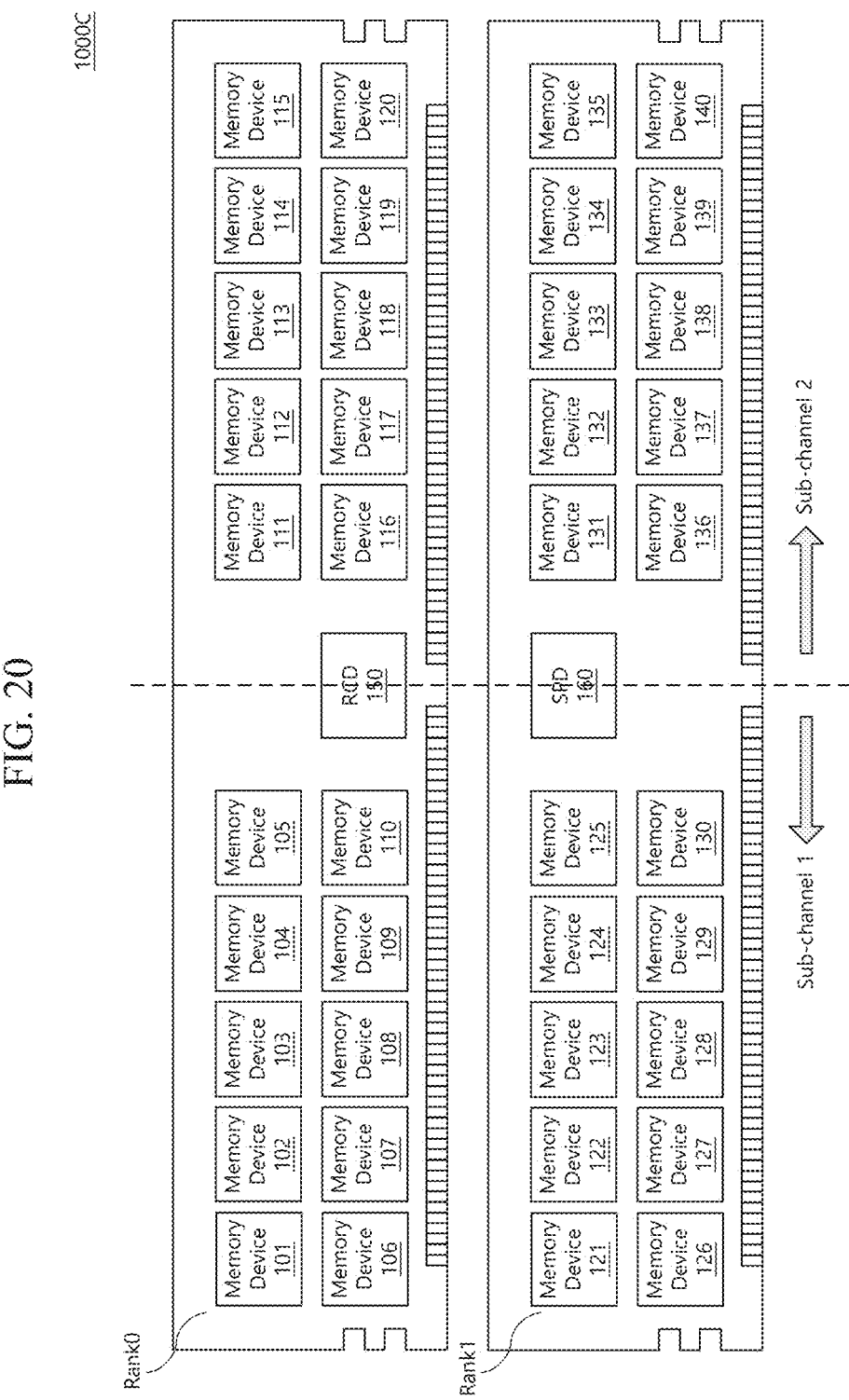

According some implementations, the memory module may communicate with the memory controller 100 through different sub-channels, as illustrated in FIGS. 20 and 21 to be described below.

FIGS. 20 and 21 are diagrams illustrating examples of memory module 1000C and 1000D according to some implementations, respectively. In FIG. 20, the memory module 1000C may include a plurality of memory devices 101 to 140 disposed on both surfaces thereof. Each of the memory devices 101 to 140 may be the memory device 200 described in FIGS. 1 to 17.

A plurality of memory devices 101 to 120 disposed on a first surface of the memory module 1000C may be divided to the left and right with respect to a register clock driver 150. A plurality of memory devices 121 to 140 disposed on a second surface of the memory module 1000C may be divided to the left and right with respect to an SPD 160.

The memory devices of the memory module 1000C may communicate with the memory controller 100 through two sub-channels. For example, the memory devices 101 to 110 and 121 to 130 disposed on the left side of the memory module 1000C may communicate with the memory controller 100 (see FIG. 1) through a first sub-channel Sub_Channel 1. The memory devices 111 to 120 and 31 to 140 disposed on the right side of the memory module 1000C may communicate with the memory controller 100 through a second sub-channel Sub_Channel 2.

In FIG. 21, the memory module 1000D may include a plurality of memory devices 101 to 140 disposed on both surfaces thereof. Each of the memory devices 101 to 140 may be the memory device 200 described in FIGS. 1 to 17.

In addition, the plurality of memory devices 101 to 120 disposed on a first surface of the memory module 1000D may be divided to the left and right with respect to a register clock driver 150. The plurality of memory devices 121 to 140 disposed on a second surface of the memory module 1000D may be divided to the left and right with respect to an SPD 160.

The memory devices of the memory module 1000D may communicate with a memory controller 100 through four sub-channels. For example, the memory devices 101, 102, 106, 107, 121, 122, 126, and 127 disposed on the far left of the memory module 1000D may communicate with the memory controller 100 through a first sub-channel Sub_Channel 1. The memory devices 103, 104, 108, 109, 123, 124, 128, and 129 disposed on a leftmost side of the memory module 1000D may communicate with the memory controller 100 through a second sub-channel Sub_Channel 2.

The memory devices 114, 115, 119, 120, 134, 135, 139, and 140 disposed on a rightmost side of the memory module 1000D may communicate with the memory controller 100 through a fourth sub-channel Sub_Channel 4. The memory devices 112, 113, 117, 118, 132, 133, 137, and 138 disposed on a right side of the memory module 1000D may communicate with the memory controller 100 through a third sub-channel Sub_Channel 3.

A portion of the memory devices 105, 110, 111, 116, 125, 130, 131, and 136 may be assigned as chips for ECC operation, or may communicate with the memory controller 100 through the second or third sub-channel.

As set forth above, a memory device according to example embodiments may efficiently support metadata mode.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. A memory device comprising:
a bank array comprising a plurality of memory cells;
a row decoder connected to the bank array through a plurality of wordlines; and
a column decoder connected to the bank array through a plurality of column select lines,
wherein the bank array comprises:
a first region; and
a second region different from the first region, and
wherein first metadata of first normal data stored in the first region is stored in the second region and second metadata of second normal data stored in the second region is stored in the first region.

2. The memory device of claim 1,
wherein the first region corresponds to first column select lines among the plurality of column select lines,
wherein the second region corresponds to second column select lines among the plurality of column select lines, and
wherein the second column select lines are different from the first column select lines.

3. The memory device of claim 1, wherein the first region and the second region are commonly connected to the plurality of wordlines.

4. The memory device of claim 1,
wherein the first normal data and the first metadata are configured to be output through a first data pin, and
wherein the second normal data and the second metadata are configured to be output through a second data pin that is different from the first data pin.

5. The memory device of claim 4,
wherein the first normal data and the first metadata are configured to be sequentially output through the first data pin, and
wherein the second normal data and the second metadata are configured to be sequentially output through the second data pin.

6. The memory device of claim 1,
wherein the first region comprises a plurality of first mats,
wherein the second region comprises a plurality of second mats, wherein each of the plurality of first mats comprises:
a first normal data region configured to store the first normal data; and
a first metadata region configured to store the second metadata of the second normal data, and
wherein each of the plurality of second mats comprises:
a second normal data region configured to store the second normal data; and
a second metadata region configured to store the first metadata of the first normal data.

7. The memory device of claim 6,
wherein the column decoder comprises:
a plurality of CSL blocks connected to the plurality of column select lines; and
an error correction code (ECC) block disposed in a center of the plurality of CSL blocks, and
wherein the plurality of first mats corresponding to the first region and the plurality of second mats corresponding to the second region are distinguished based on the ECC block.

8. The memory device of claim 6,
wherein each of the plurality of first mats included in the first region corresponds to two CSL groups,
wherein each of the plurality of second mats included in the second region corresponds to two CSL groups,
wherein each of the two CSL groups corresponding to the plurality of first mats comprises first column select lines assigned to store the first normal data, and second column select lines assigned to store the second metadata, and
wherein each of the two CSL groups corresponding to the plurality of second mats comprises third column select lines assigned to store the second normal data, and comprises fourth column select lines assigned to store the first metadata.

9. The memory device of claim 1,
wherein the first normal data and the first metadata are configured to be output through a first data pin and a second data pin, respectively, and
wherein the second normal data and the second metadata are configured to be output through a third data pin and a fourth data pin, respectively.

10. A memory device comprising:
a bank array comprising a first region and a second region;
a row decoder connected to the first region and the second region through a plurality of wordlines disposed across the first region and the second region; and
a column decoder connected to the first region through a plurality of first column select lines disposed in the first region and connected to the second region through a plurality of second column select lines disposed in the second region,
wherein first metadata of first normal data stored in the first region is stored in the second region, and second metadata of second normal data stored in the second region is stored in the first region.

11. The memory device of claim 10,
wherein the column decoder comprises:
first CSL blocks connected to a first CSL group and a second CSL group disposed in the first region; and
second CSL blocks connected to a third CSL group and a fourth CSL group disposed in the second region,
wherein the first CSL group disposed in the first region comprises a first plurality of column select lines assigned to store the first normal data, and a second plurality of column select lines assigned to store the second metadata, wherein the second CSL group disposed in the first region comprises a third plurality of column select lines assigned to store the first normal data, and a fourth plurality of column select lines assigned to store the second metadata, wherein the third CSL group disposed in the second region comprises a fifth plurality of column select lines assigned to store the second normal data, and a sixth plurality of column select lines assigned to store the first metadata, and wherein the fourth CSL group disposed in the second region comprises a seventh plurality of column select lines assigned to store the second normal data, and an eighth plurality of column select lines assigned to store the first metadata.

12. The memory device of claim 11, wherein the first CSL blocks are configured to simultaneously activate a single selected column select line, among the first plurality of column select lines, and a single selected column select line, among the second plurality of column select lines, in response to a column address for the first normal data.

13. The memory device of claim 12, wherein the second CSL blocks are configured to activate a single selected column select line, among the sixth plurality of column select lines and the eighth plurality of column select lines, in response to a column address for the first metadata.

14. The memory device of claim 12, wherein the column decoder further comprises an error correction code (ECC) block disposed between the first CSL blocks and the second CSL blocks, and wherein the first region and the second region are distinguished along a column-direction line connected to the ECC block.

15. The memory device of claim 10, wherein the first normal data and the first metadata are configured to be sequentially output through a first data pin, wherein the second normal data and the second metadata are configured to be sequentially output through a second data pin, and wherein the second data pin is different from the first data pin.

16. A memory module comprising a plurality of memory devices, wherein each of the plurality of memory devices comprises:

a bank array comprising a plurality of memory cells;

a row decoder connected to the bank array through a plurality of wordlines; and a column decoder connected to the bank array through a plurality of column select lines, wherein the bank array comprises:

a first region; and a second region, different from the first region, and wherein first metadata of first normal data stored in the first region is stored in the second region, and second metadata of second normal data stored in the second region is stored in the first region.

17. The memory module of claim 16, wherein the first region corresponds to first column select lines among the plurality of column select line, wherein the second region corresponds to second column select lines among the plurality of column select lines, wherein the second column select lines are different from the first column select lines, and wherein the first region and the second region are commonly connected to the plurality of wordlines.

18. The memory module of claim 16, wherein the first region comprises a plurality of first mats, wherein the second region comprises a plurality of second mats, wherein each of the plurality of first mats comprises:

a first normal data region configured to store the first normal data; and a first metadata region configured to store the second metadata of second normal data, and wherein each of the plurality of second mats comprises:

a second normal data region configured to store the second normal data; and a second metadata region configured to store the first metadata of first normal data.

19. The memory module of claim 18, wherein the column decoder comprises:

a plurality of CSL blocks connected to the plurality of column select lines; and an error correction code (ECC) block disposed in a center of the plurality of CSL blocks, and wherein the plurality of first mats corresponding to the first region and the plurality of second mats corresponding to the second region are distinguished based on the ECC block.

20. The memory module of claim 16, wherein the first normal data and the first metadata are configured to be sequentially output through a first data pin, wherein the second normal data and the second metadata are configured to be sequentially output through a second data pin, and wherein the second data pin is different from the first data pin.

* * * * *